(12) United States Patent
Grobis et al.

(10) Patent No.: US 11,894,037 B2
(45) Date of Patent: Feb. 6, 2024

(54) FIRST FIRE AND COLD START IN MEMORIES WITH THRESHOLD SWITCHING SELECTORS

(71) Applicant: SanDisk Technologies LLC, Addison, TX (US)

(72) Inventors: Michael Grobis, Campbell, CA (US); James W. Reiner, Palo Alto, CA (US); Michael Nicolas Albert Tran, San Jose, CA (US); Juan P. Saenz, Menlo Park, CA (US); Gerrit Jan Hemink, Eindhoven (NL)

(73) Assignee: SanDisk Technologies LLC, Addison, TX (US)

( * ) Notice: Subject to any disclaimer, the term of this patent is extended or adjusted under 35 U.S.C. 154(b) by 141 days.

(21) Appl. No.: 17/718,759

(22) Filed: Apr. 12, 2022

(65) Prior Publication Data

US 2023/0326506 A1    Oct. 12, 2023

(51) Int. Cl.
*G11C 13/00*  (2006.01)
*G11C 11/16*  (2006.01)
(Continued)

(52) U.S. Cl.
CPC ............ *G11C 11/1659* (2013.01); *G11C 7/20* (2013.01); *G11C 13/003* (2013.01); *H01L 24/08* (2013.01);
(Continued)

(58) Field of Classification Search
CPC .................................................. G11C 13/003
See application file for complete search history.

(56) References Cited

U.S. PATENT DOCUMENTS 6,930,909 B2    8/2005    Moore et al.
7,936,593 B2    5/2011    Savransky
(Continued)

FOREIGN PATENT DOCUMENTS

KR    20200053131 A    5/2020
KR    20210154077 A    12/2021

OTHER PUBLICATIONS

U.S. Appl. No. 17/090,438, filed Nov. 5, 2020.
(Continued)

*Primary Examiner* — Jason Lappas
(74) *Attorney, Agent, or Firm* — Vierra Magen Marcus LLP

(57) ABSTRACT

In a memory array with a cross-point structure, at each cross-point junction a programmable resistive memory element, such as an MRAM memory cell, is connected in series with a threshold switching selector, such as an ovonic threshold switch. The threshold switching selector switches to a conducting state when a voltage above a threshold voltage is applied. When powered down for extended periods, the threshold voltage can drift upward. If the drift is excessive, this can make the memory cell difficult to access and can disturb stored data values when accessed. Techniques are presented to determine whether excessive voltage threshold drift may have occurred, including a read based test and a time based test. Techniques are also presented for initializing a cross-point array, for both first fire and cold start, by using voltage levels shifted from half-select voltage levels used in a standard memory access.

20 Claims, 29 Drawing Sheets

(51) Int. Cl.
    *G11C 7/20*       (2006.01)
    *H01L 25/065*     (2023.01)
    *H01L 23/00*      (2006.01)
    *H01L 25/18*      (2023.01)

(52) U.S. Cl.
    CPC .......... *H01L 25/0657* (2013.01); *H01L 25/18* (2013.01); *H01L 2224/08145* (2013.01); *H01L 2924/1431* (2013.01); *H01L 2924/1443* (2013.01)

(56) References Cited

U.S. PATENT DOCUMENTS

| | | | |
|---|---|---|---|
| 8,036,013 | B2 | 10/2011 | Lowrey et al. |
| 8,320,157 | B2 | 11/2012 | Ichihara et al. |
| 8,649,212 | B2 | 2/2014 | Kau et al. |
| 9,224,465 | B2 | 12/2015 | Franklin et al. |
| 9,627,055 | B1 | 4/2017 | Robustelli |
| 10,192,616 | B2 | 1/2019 | O'Toole et al. |
| 11,222,678 | B1 | 1/2022 | Parkinson et al. |
| 2013/0028024 | A1 | 1/2013 | Tanzawa |
| 2018/0151204 | A1 | 5/2018 | Hong et al. |
| 2019/0006420 | A1 | 1/2019 | Wells et al. |
| 2021/0089221 | A1* | 3/2021 | Siau .................. G11C 13/003 |
| 2022/0108739 | A1 | 4/2022 | Parkinson et al. |

OTHER PUBLICATIONS

Response to Office Action dated May 9, 2022, U.S. Appl. No. 17/090,438, filed Nov. 5, 2020.
Response to Office Action dated May 19, 2023, U.S. Appl. No. 17/943,550, filed Sep. 13, 2022.
Notice of Allowance dated Jun. 7, 2023, U.S. Appl. No. 17/943,550, filed Sep. 13, 2022.
Non-final Office Action dated Dec. 10, 2021, U.S. Appl. No. 17/090,438, filed Nov. 5, 2020.
Non-final Office Action dated Jun. 15, 2022, U.S. Appl. No. 17/090,438, filed Nov. 5, 2020.
Non-final Office Action dated Mar. 2, 2023, U.S. Appl. No. 17/943,550, filed Sep. 13, 2022.

* cited by examiner

(12) United States Patent
US 11,894,037 B2

FIRST FIRE AND COLD START IN MEMORIES WITH THRESHOLD SWITCHING SELECTORS

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, it is challenging to achieve high bit density and high endurance for fast write operations with previous MRAM memory cell designs.

BRIEF DESCRIPTION OF THE DRAWING

Like-numbered elements refer to common components in the different figures.

DETAILED DESCRIPTION

Figure 1:
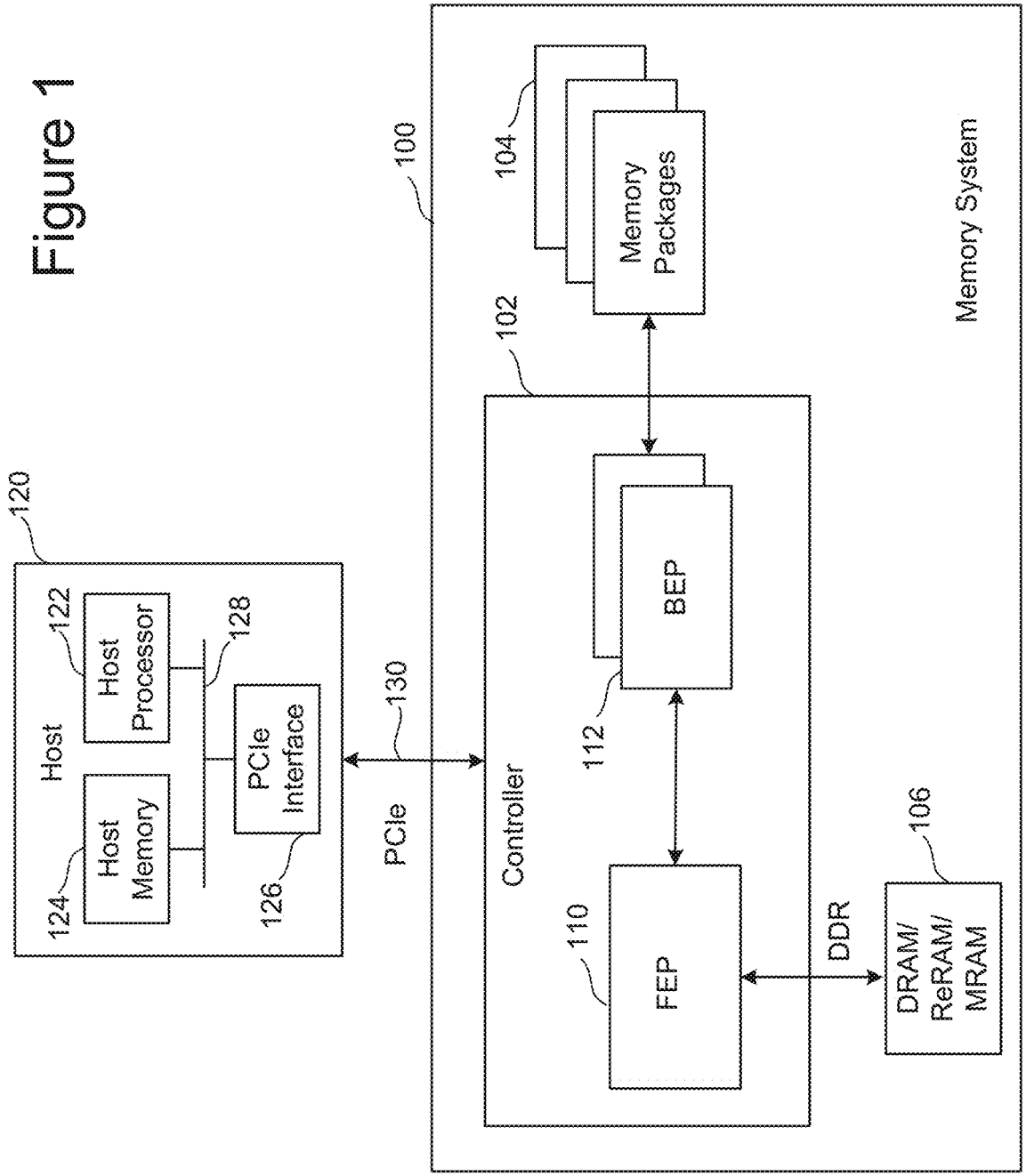
FIG. 1 is a block diagram of one embodiment of a memory system connected to a host.

In a memory array with a cross-point type architecture, a first set of conductive lines run across the surface of a substrate and a second set of conductive lines are formed over the first set of conductive lines, running over the substrate in a direction perpendicular to the first set of conductive lines. The memory cells are located at the cross-point junctions of the two sets of conductive lines. Embodiments for the memory cells can include a programmable resistance element, such as an MRAM memory cell, connected in series with a selector switch. One type of selector switch is threshold switching selector, such as ovonic threshold switch, that can be implemented in a small amount of area, and without need of an additional control line, relative to other switching elements, such as a transistor. If a voltage above a certain level, the threshold voltage, is applied across a threshold switching selector, it will switch to a conducting state.

Threshold switching selectors exhibit a property of threshold voltage drift where, if not turned on for an extended period, the threshold voltage drifts to a higher value. This can make it difficult or even impossible to access the data stored on the array as the threshold voltage may exceed the maximum voltage level available on the memory device. Even if the threshold switching selector can be turned on, the resultant voltage applied across the memory when the device turns on may disturb the data stored in the memory cell or even damage the memory cell. This problem is particularly acute when a memory device is powered down for an extended period. Accordingly, the following presents techniques for inferring whether the threshold voltages of the threshold switching selectors on a memory array that has been powered down may have drifted to excessively high values. This process can be performed as part of a test in the power up process and can include a read-based test or a time-based test.

Techniques are also presented for more effective initialization of the threshold switching selectors of a memory array, both at first fire (when a new device is first turned on) and at cold start (once the device is in use, but has not been recently accessed). For memory arrays using a cross-point architecture, where each memory cell is connected between a corresponding bit line and a corresponding word line, memory cells can be accessed using a half-select biasing scheme where an access voltage is applied between a selected word line and a selected bit line, such applying a voltage Vapp to a selected word line and setting the bit line to ground (or vice versa), while the other, unselected word lines and bit lines are set to ½Vapp. In an initialization process, when initializing a set of memory cells by applying an initialization voltage (that may be the same as or raised relative to a standard access voltage) to the initialization-selected memory cells, in order to reduce leakage though memory cells not currently being initialized, the unselected bit lines and word lines can use a voltage level shifted relative to the normal half-select values. For example, when initializing selected memory cells of an array by setting a selected word line at Vapp and a selected bit line at ground, unwanted leakage can be reduced by setting unselected bit lines at a voltage shifted a value greater than ½Vapp and setting unselected word lines at a voltage shifted to a value less than ½Vapp.

FIG. 1 is a block diagram of one embodiment of a memory system 100 connected to a host 120. Memory system 100 can implement the technology presented herein for determining whether the threshold voltage of the threshold switching selectors used in a cross-point memory array have drifted excessively. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1 comprises a controller 102, non-volatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host 120.

Figure 2:
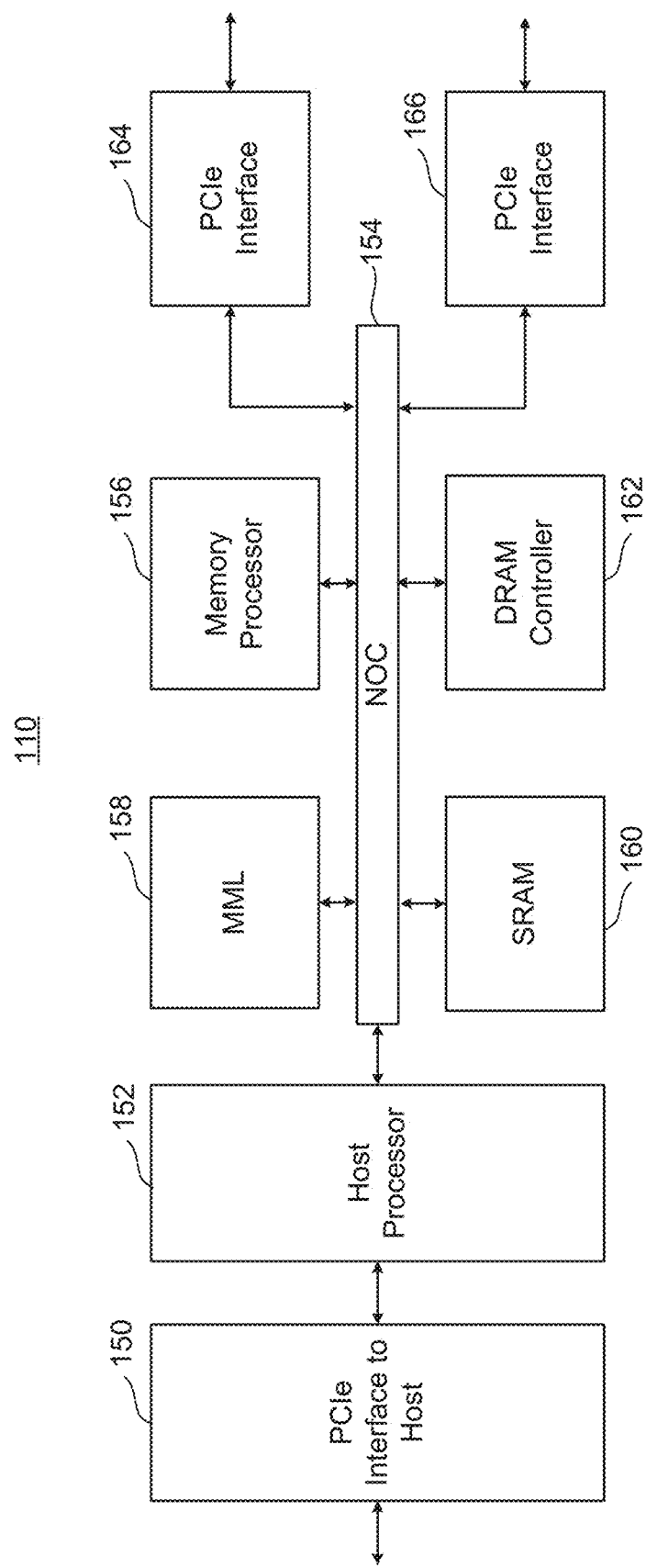
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
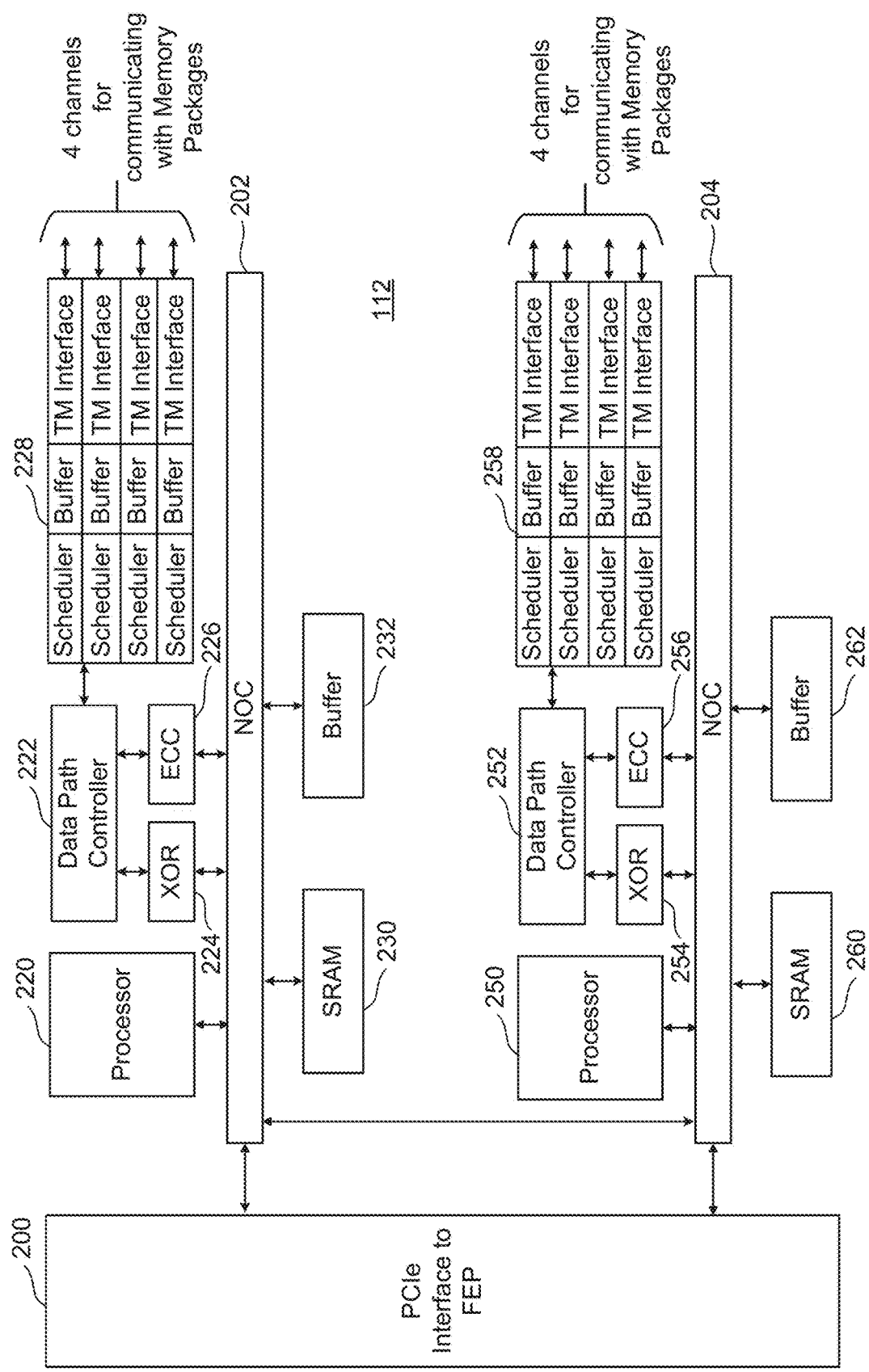
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
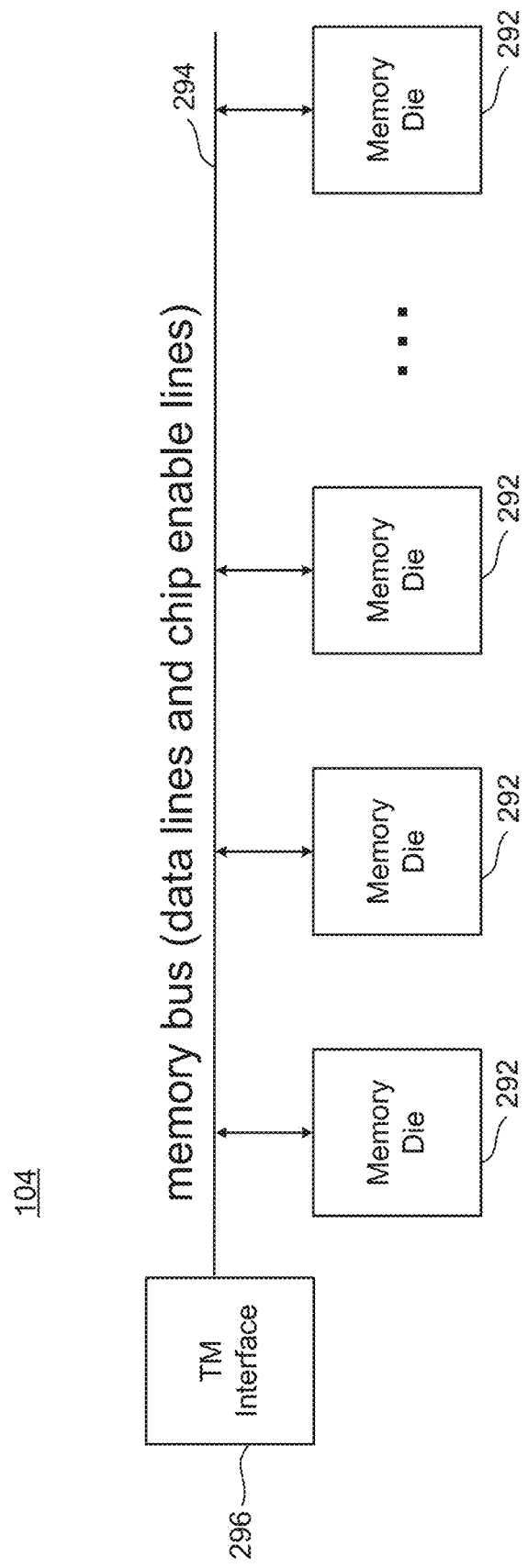
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 5:
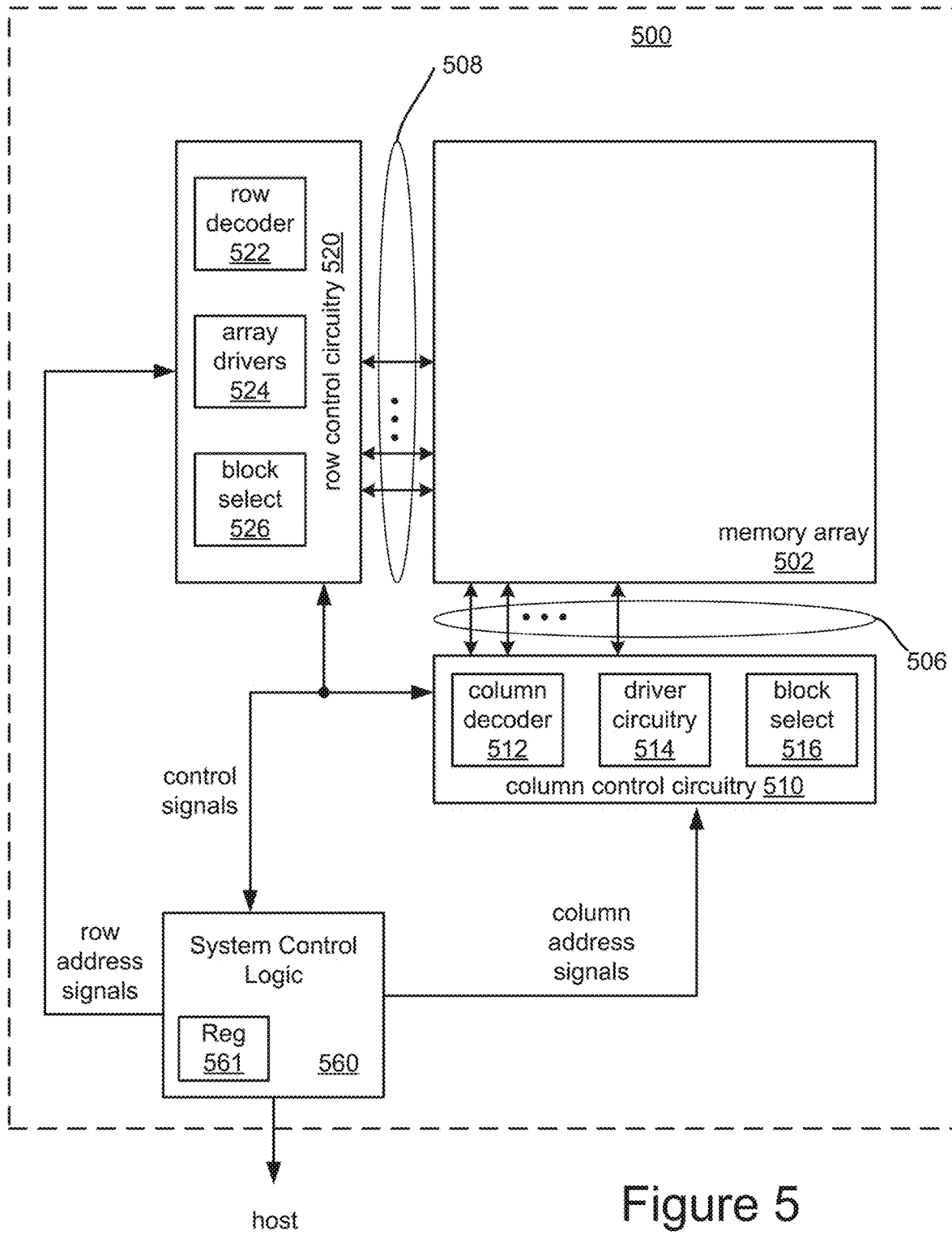
FIG. 5 is a block diagram of one embodiment of a memory die.

FIG. 5 is a block diagram that depicts one example of a memory system 500 that can implement the technology described herein. Memory system 500 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory system 500 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Memory system 500 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine that provides die-level control of memory operations. In one embodiment, the state machine is programmable by software. In other embodiments, the state machine does not use software and is completely implemented in hardware (e.g., electrical circuits). In another embodiment, the state machine is replaced by a microcontroller, with the micro-controller either on or off the memory chip. The system control logic 560 can also include a power control module controls the power and voltages supplied to the rows and columns of the memory 502 during memory operations and may include charge pumps and regulator circuit for creating regulating voltages. System control logic 560 may include one or more state machines, registers and other control logic for controlling the operation of memory system 500. FIG. 5 illustrates such registers at 561, which, for example, can be used to store data related to the processes related to the threshold voltages Vth of threshold switching selectors, as discussed in more detail below. In some embodiments, all of the elements of memory system 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560, or other analogous circuits that are used to control non-volatile memory.

Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data using magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a programming current pulse. Note that the use of "pulse" in this document does not require a square pulse but includes a (continuous or non-continuous) vibration or burst of sound, current, voltage light, or other wave. Said memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
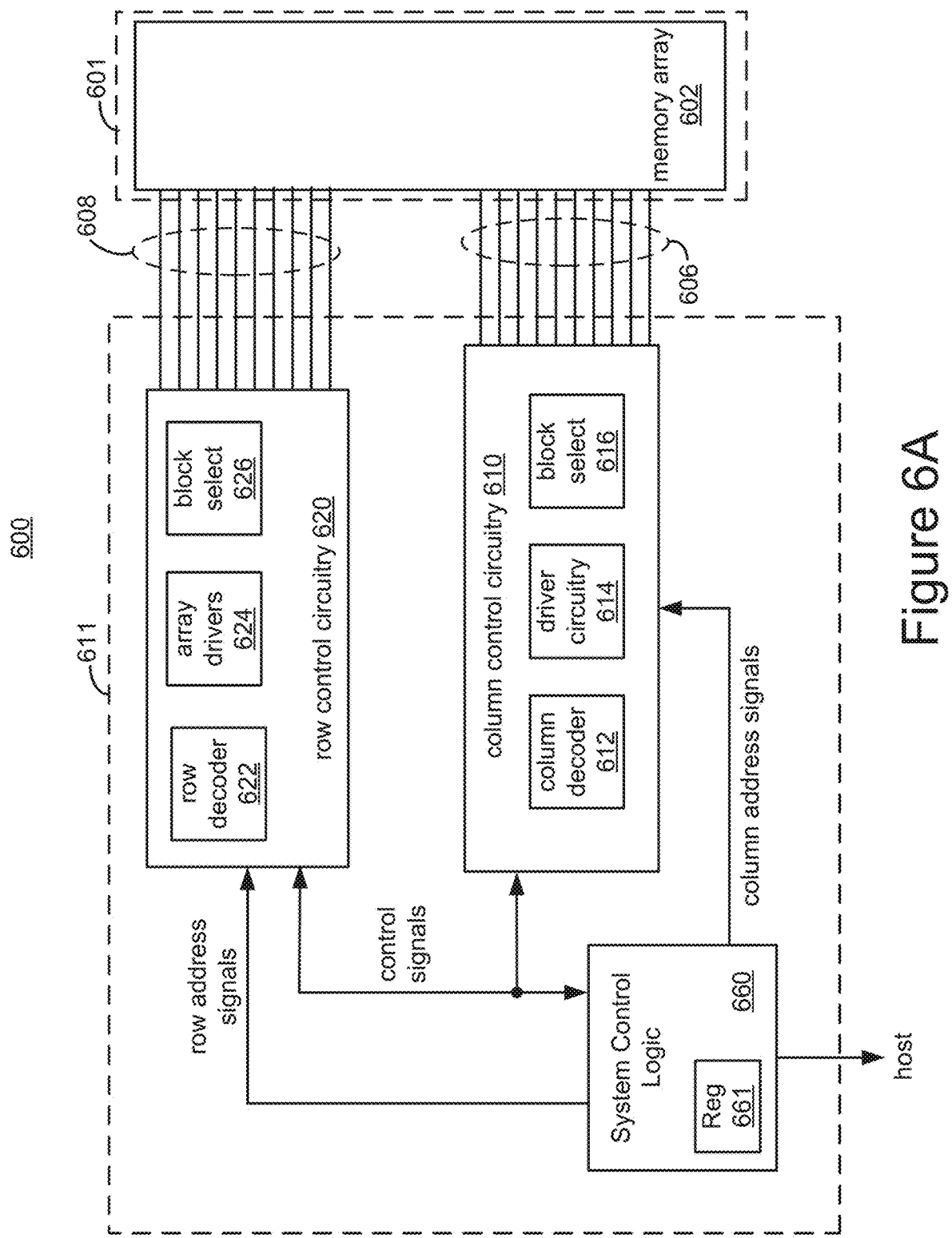
FIGS. 6A and 6B illustrate an example of control circuits coupled to a memory structure through wafer-to-wafer bonding.
Figure 6B:
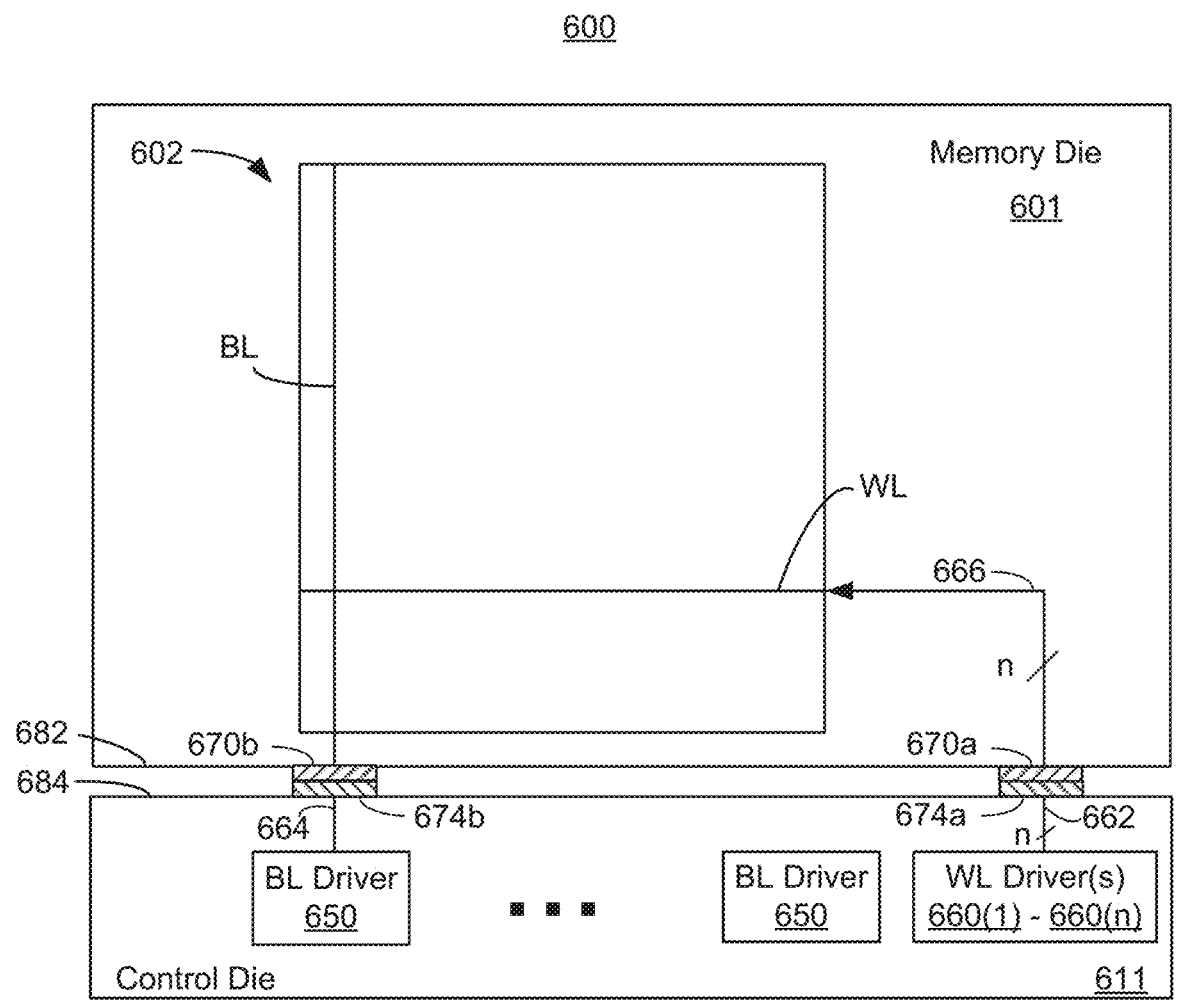

FIGS. 6A and 6B shows an alternative arrangement to that of FIG. 5, which may be implemented using wafer-to-wafer bonding to provide a bonded die pair for memory system 600. FIG. 6A shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 660, row control circuitry 620, and column control circuitry 610 (which may be formed by a CMOS process) are located in control die 608. Additional elements, such as functionalities from controller 102, can also be moved into the control die 608. System control logic 660, row control circuitry 620, and column control circuitry 610 may be formed by a common process (e.g., CMOS process), so that adding elements and functionalities more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die of memory system 500 may reduce the number of steps needed to fabricate such a die, adding such circuits to a die such as control die 611 may not require any additional process steps.

FIG. 6A shows column control circuitry 610 on the control die 611 coupled to memory structure 602 on the memory die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory die 601, which are connected to bit lines of memory structure 602. Each bit line of memory structure 602 may have a corresponding electrical path in electrical paths 606, including a pair of bonded pads, that connects to column control circuitry 610. Similarly, row control circuitry 620, including row decoder 622, array drivers 624, and block select 626, are coupled to memory structure 602 through electrical paths 608. Each of electrical path 608 may correspond to a word line, dummy word line, or select gate line. Additional electrical paths may also be provided between control die 611 and memory die 601.

FIG. 6B is a block diagram showing more detail on the arrangement of one embodiment of the integrated memory assembly of bonded die pair 600. Memory die 601 contains a plane or array 602 of memory cells. The memory die 601 may have additional planes or arrays. One representative bit line (BL) and representative word line (WL) 666 is depicted for each plane or array 602. There may be thousands or tens of thousands of such bit lines per each plane or array 602. In one embodiment, an array or plane represents a groups of connected memory cells that share a common set of unbroken word lines and unbroken bit lines.

Control die 611 includes a number of bit line drivers 650. Each bit line driver 650 is connected to one bit line or may be connected to multiple bit lines in some embodiments. The control die 611 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 provide voltages to the word lines in memory die 601. As discussed above with respect to FIG. 6A, the control die 611 may also include charge pumps, voltage generators, and the like that are not represented in FIG. 6B, which may be used to provide voltages for the word line drivers 660 and/or the bit line drivers 650.

The memory die 601 has a number of bond pads 670a, 670b on a first major surface 682 of memory die 601. There may be "n" bond pads 670a, to receive voltages from a corresponding "n" word line drivers 660(1)-660(n). There may be one bond pad 670b for each bit line associated with array 602. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 600. For example, the data bus between the memory controller 102 and the integrated memory assembly 600 may, for example, provide for eight, sixteen, or perhaps 32 bits to be transferred in parallel. However, the data bus between the memory controller 102 and the integrated memory assembly 600 is not limited to these examples. Such ECC may be implemented on the memory die in some embodiments.

The control die 611 has a number of bond pads 674a, 674b on a first major surface 684 of control die 611. There may be "n" bond pads 674a, to deliver voltages from a corresponding "n" word line drivers 660(1)-660(n) to memory die 601. There may be one bond pad 674b for each bit line associated with array 602. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 601 to the control die 611. Also, the bond pads 670, 674 permit internal signal transfer between the memory die 601 and the control die 611. Thus, the memory die 601 and the control die 611 are bonded together with bond pads. Although FIG. 6A depicts one control die 611 bonded to one memory die 601, in another embodiment one control die 611 is bonded to multiple memory dies 601.

Herein, "internal signal transfer" means signal transfer between the control die 611 and the memory die 601. The internal signal transfer permits the circuitry on the control die 611 to control memory operations in the memory die 601. Therefore, the bond pads 670, 674 may be used for memory operation signal transfer. Herein, "memory operation signal transfer" refers to any signals that pertain to a memory operation in a memory die 601. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier may be electrically connected to bond pad 674b by pathway 664. Relative to FIG. 6A, the electrical paths 606 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 608 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 601 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 5 and 6A will mainly be discussed in the context of a cross-point architecture, although much of the discussion can be applied more generally. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells. In particular, an exemplary embodiment uses a MRAM memory cells consisting of an MRAM memory element used in conjunction with a threshold switching selector.

Figure 7A:
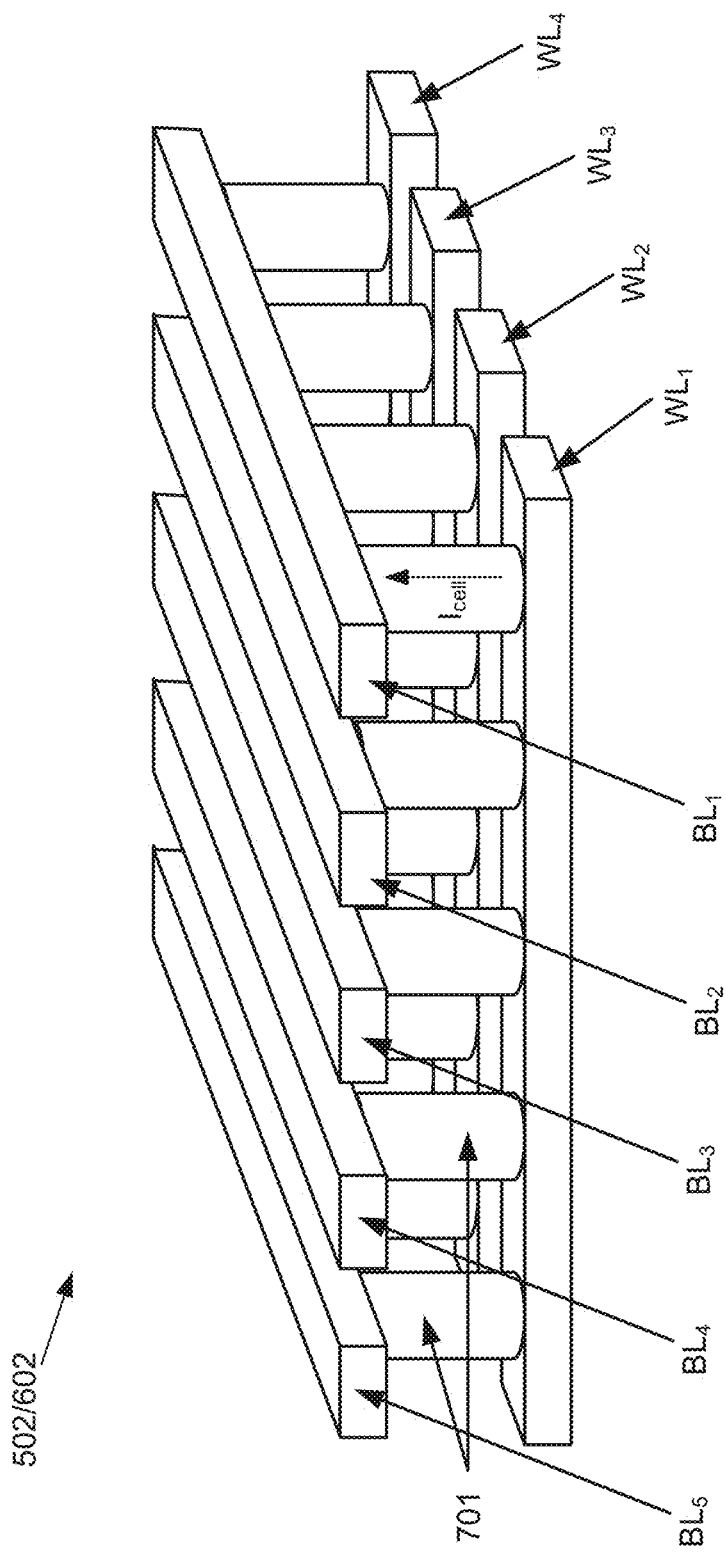
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 5 or 602 in FIG. 6A, where a memory die can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, FeRAM, or other material with a programmable resistance. The following discussion will focus on MRAM memory cells, although much of the discussion can be applied more generally. The current in the memory cells of the first memory level is shown as flowing upward as indicated by arrow $I_{cell}$, but current can flow in either direction, as is discussed in more detail in the following.

Figure 7B:
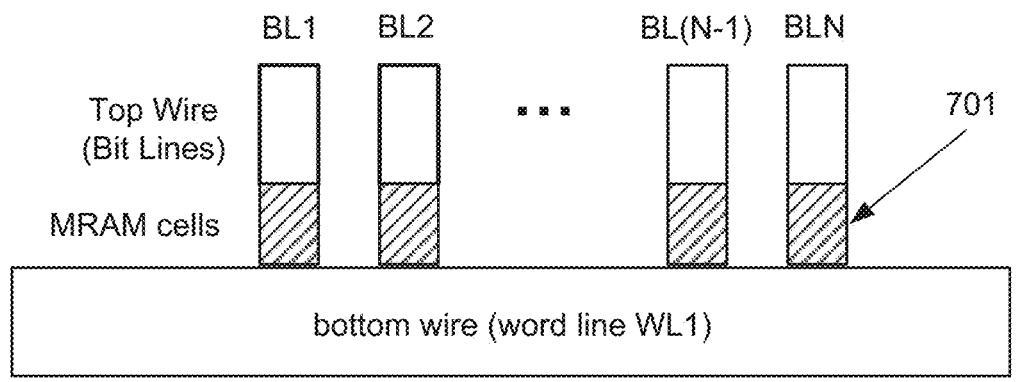
FIGS. 7B and 7C respectively present side and top views of the cross-point structure in FIG. 7A.
Figure 7C:
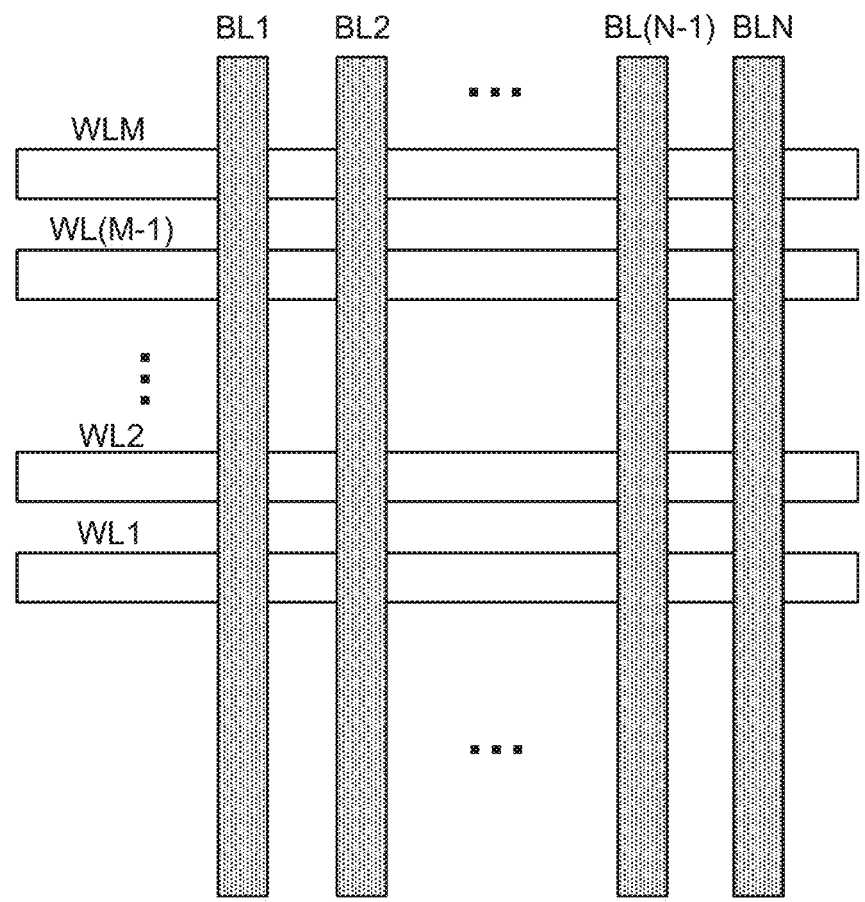

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 1201, although PCM, FeRAM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A 2-layer example is illustrated in FIG. 7D.

Figure 7D:
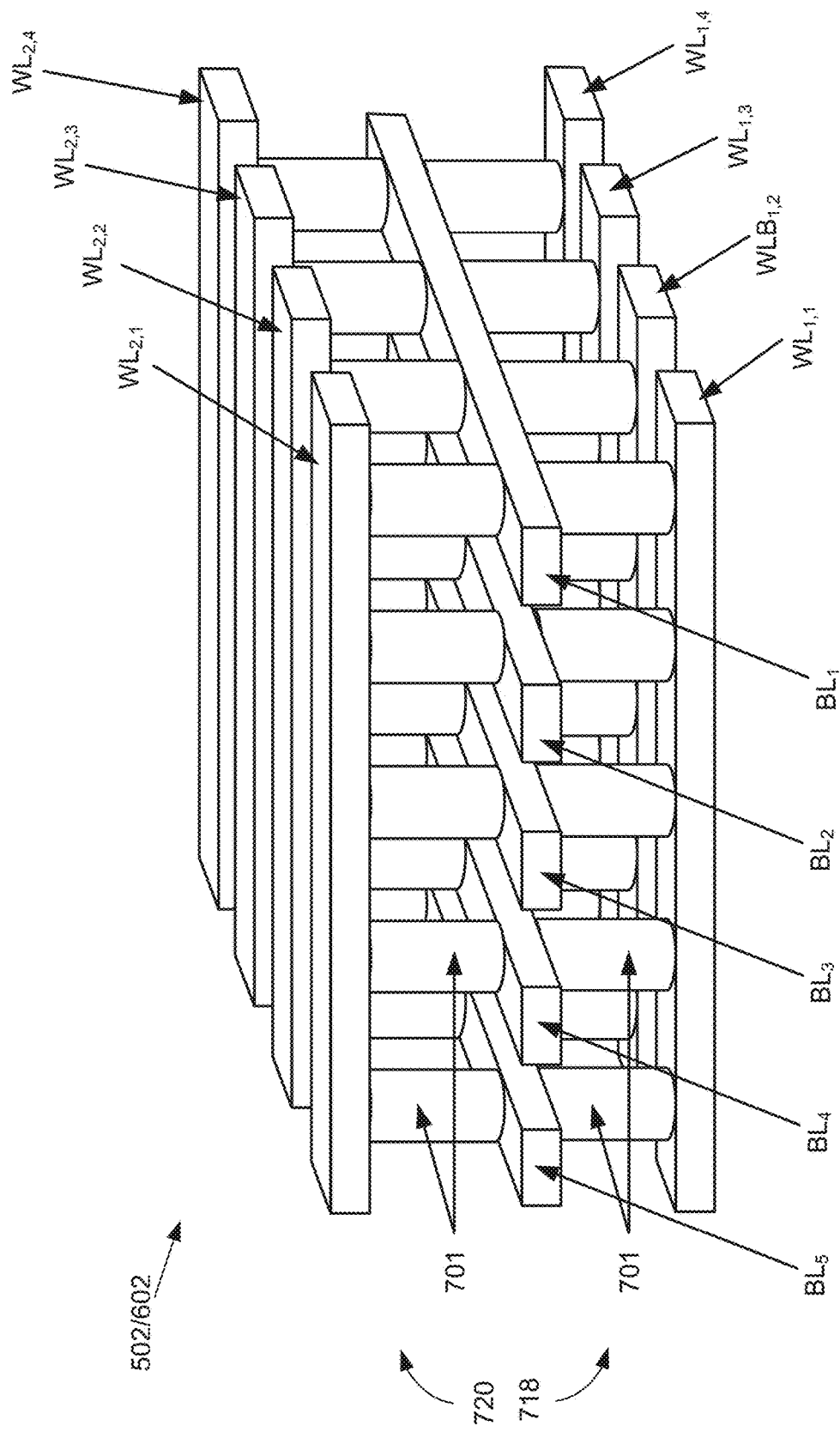
FIG. 7D depicts an embodiment of a portion of a two level memory array that forms a cross-point architecture in an oblique view.

FIG. 7D depicts an embodiment of a portion of a two level memory array that forms a cross-point architecture in an oblique view. As in FIG. 7A, FIG. 7D shows a first layer 718 of memory cells 701 of an array 502/602 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation, e.g., from bit line to word line for read, or to have current flow in the opposite directions, e.g., from word line to bit line for layer 1 read and from bit line to word line for layer 2 read.

The use of a cross-point architecture allows for arrays with a small footprint and several such arrays can be formed on a single die. The memory cells formed at each cross-point can a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both. Resistive type memory cells can be formed according to many of the technologies mentioned above, such as ReRAM, FeRAM, PCM, or MRAM. The following discussion is presented mainly in the context of memory arrays using a cross-point architecture with binary valued MRAM memory cells, although much of the discussion is more generally applicable.

Figure 8:
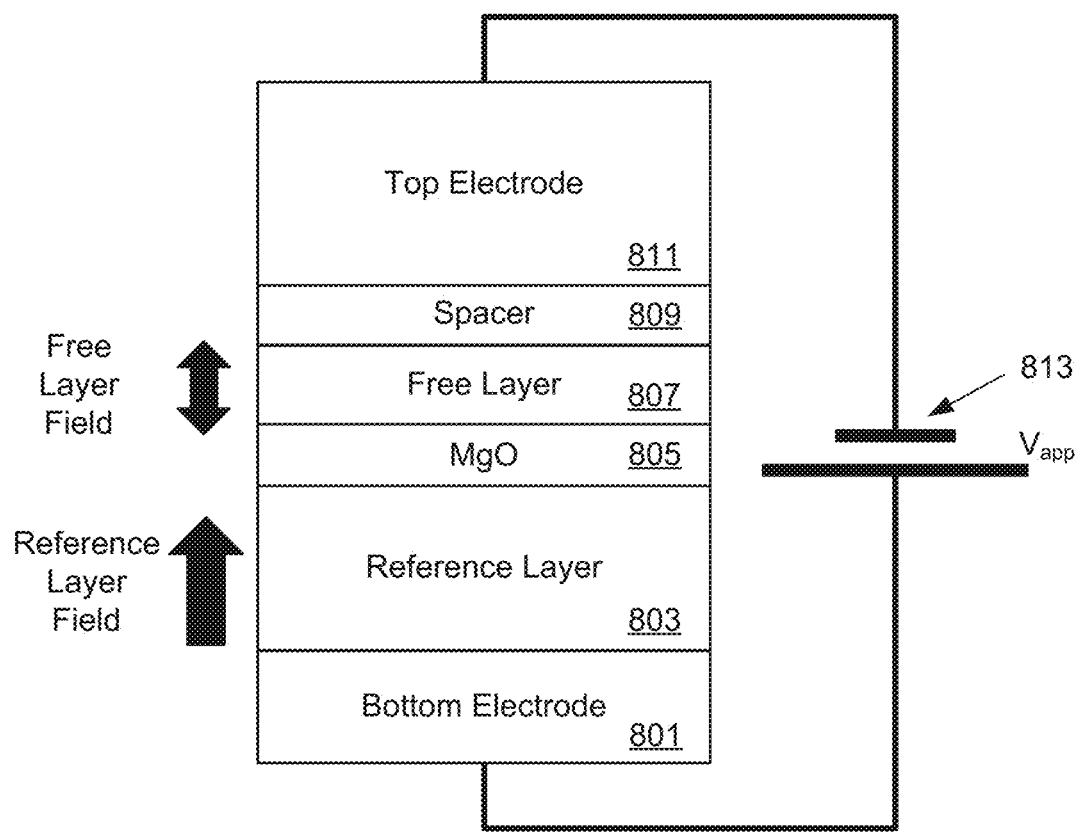
FIG. 8 illustrates an embodiment for the structure of an MRAM memory cell.
Figure 15:
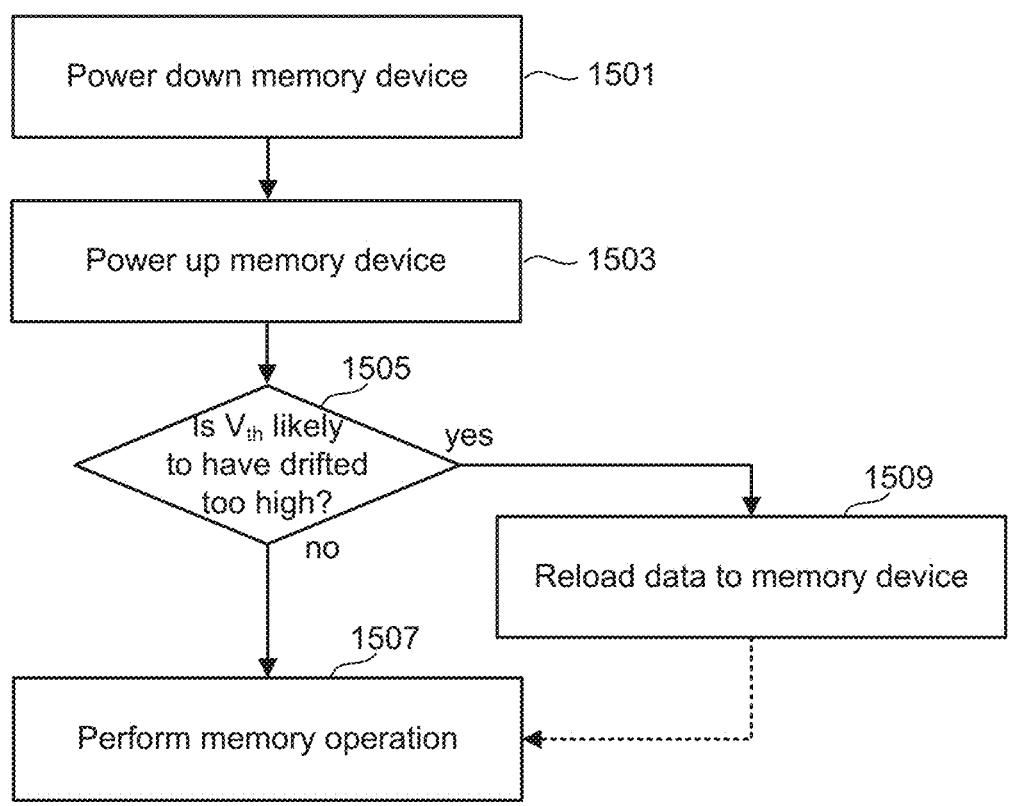
FIG. 15 is a high level flowchart of one embodiment for determining whether the threshold voltage of a threshold switching selector may have drifted.

FIG. 8 illustrates an embodiment for the structure of an MRAM element of a memory cell, where, as described below, an MRAM base memory cell is typically formed of a programmable resistance MRAM element in series with a threshold switching selector. A voltage being applied across the MRAM element, between the corresponding word line and bit line, is represented as a voltage source $V_{app}$ 813. The MRAM element includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the MRAM element is based on the relative orientation of the magnetizations of the reference layer 803 and the free layer 807: if the two layers are magnetized in the same direction, the MRAM element will be in a parallel (P) low resistance state (LRS); and if they have the opposite orientation, the MRAM element will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the MRAM element.

Figure 9:
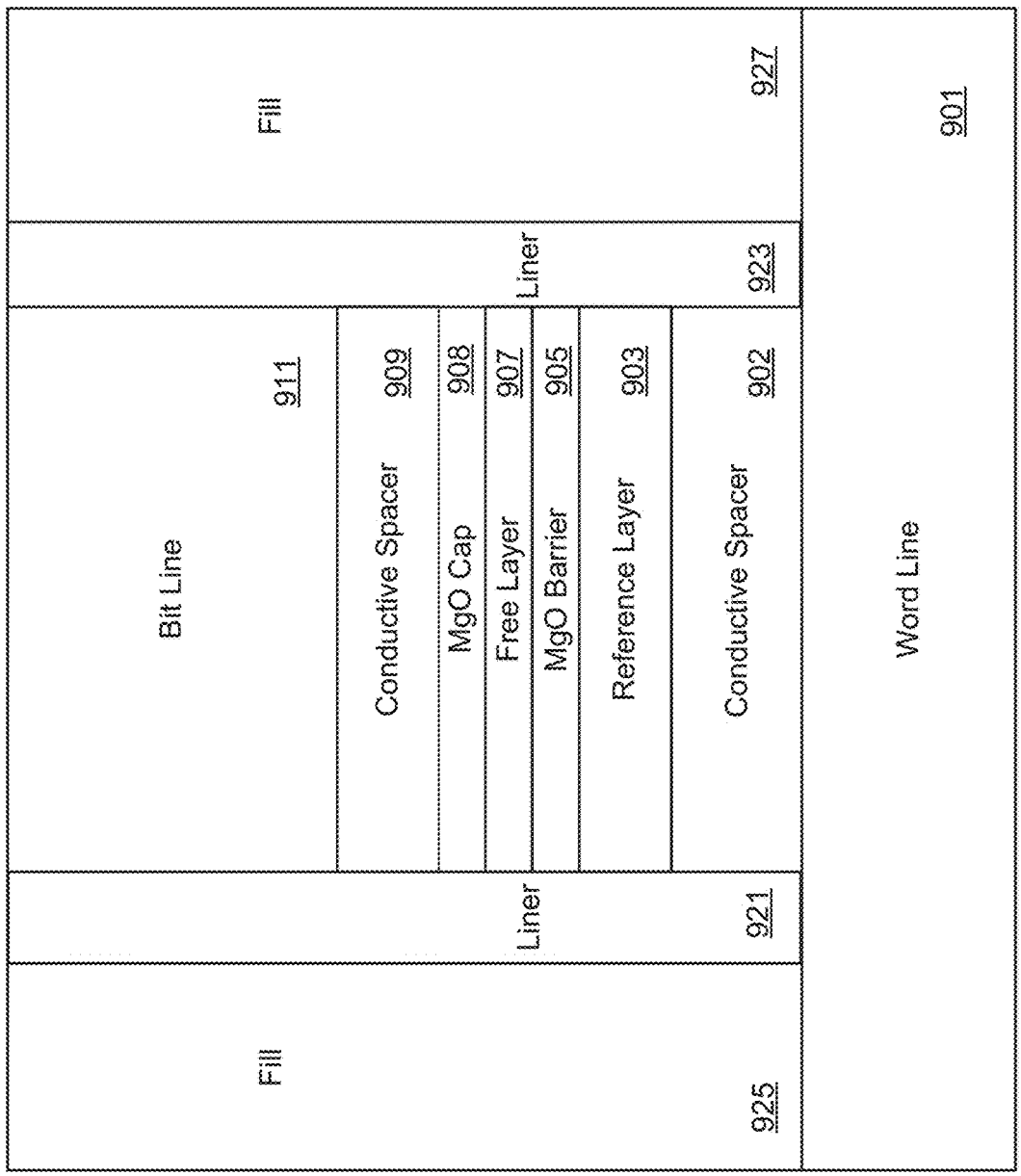
FIG. 9 illustrates an embodiment for an MRAM memory cell design as it would be implemented in a cross-point array in more detail.

FIG. 9 illustrates an embodiment for an MRAM element design as it would be implemented in a cross-point array in more detail. When placed in a cross-point array, the top and bottom electrodes of the MRAM element will be two of the adjacent layers of wires of the array, for example the top and bottom wires of the two level or two deck array. In the embodiment shown here, the bottom electrode is the word line 901 and the top electron is the bit line 911 of the memory cell, but these can be reversed in some embodiments by reversing the orientation of the memory element. Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the MRAM element structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multi-layer coupled with an Ir or Ru spacer 902. The MgO cap 908 is optional, but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM elements have a directionality and, because of this, in some circumstances there is a preference for reading in one direction over the other. For example, the optimum current amplitude to write a bit into the AP (high resistance state, HRS) may be greater than that to write to the P (low resistance state) by 50% or more, so bit error rate (read disturb) is less probable if reading to AP (2AP). Some of these circumstances and the resultant directionality of a read are discussed below. The directionality of the biasing particularly enters into some embodiments for the programming of MRAM memory cells, as is discussed further with respect to FIGS. 10A and 10B.

Figure 10A:
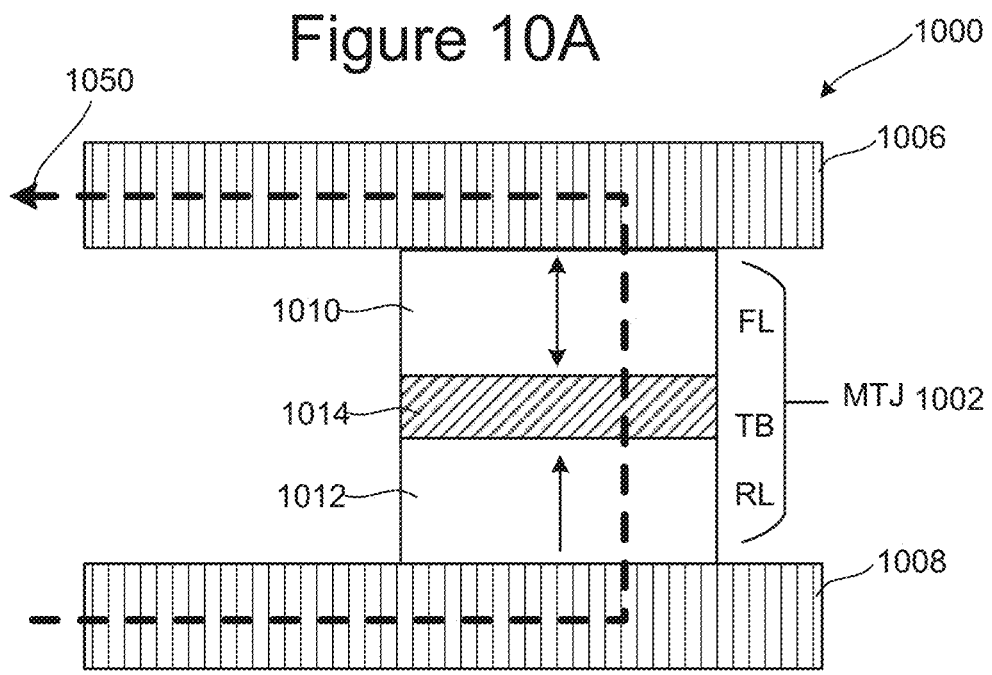
FIGS. 10A and 10B illustrate the writing of an MRAM memory cell by use of a spin torque transfer (STT) mechanism.
Figure 10B:
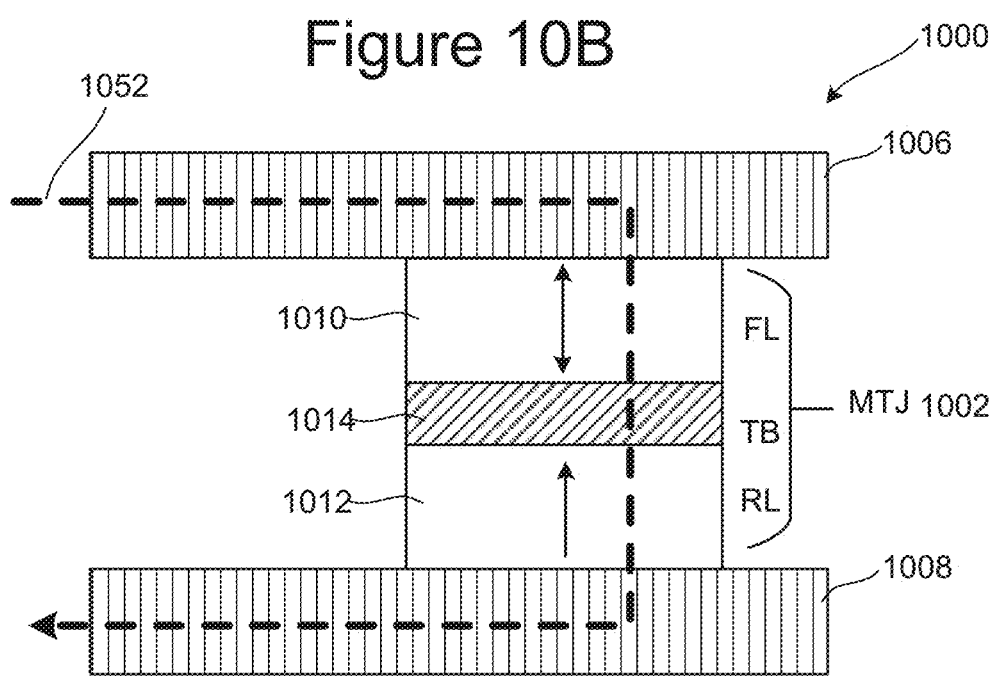

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the used of spin transfer torque to program or write to MRAM memory. Spin transfer torque magnetic random access memory (STT MRAM) has the advantages of lower power consumption and better scalability over MRAM variations such as toggle MRAM. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms of electron behavior, FIGS. 10A and 10B and their discussion are given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by use a the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e., perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is place at a higher voltage level than bottom conductor 1008, due the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can be read by measuring the resistance of the memory cell 1000. Low resistance typically represents a "0" bit and high resistance typically represents a "1" bit, although sometimes the alternate convention occurs. A read current can be applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments as the P2AP direction since more current is required to write the bit in that direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected is biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM, and FeRAM) memory cell. For example, a select transistor can be placed in series with each resistive memory cell element in FIGS. 7A-7D so that the elements 701 are now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to selector elements is the use of a threshold switching selector device in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS).

Figure 11A:
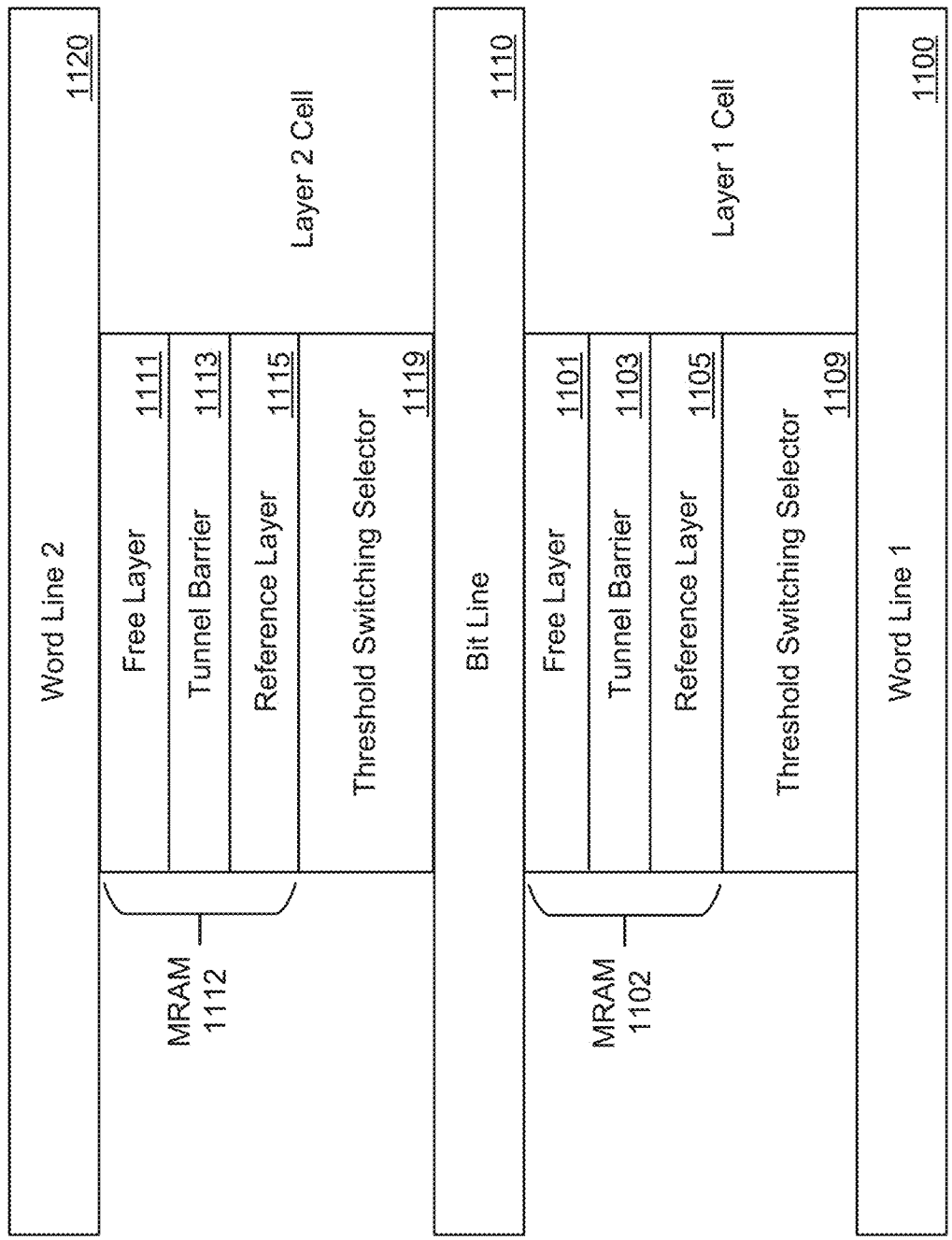
FIGS. 11A and 11B illustrate embodiments for the incorporation of threshold switching selectors into an MRAM memory array having a cross-point architecture.
Figure 11B:
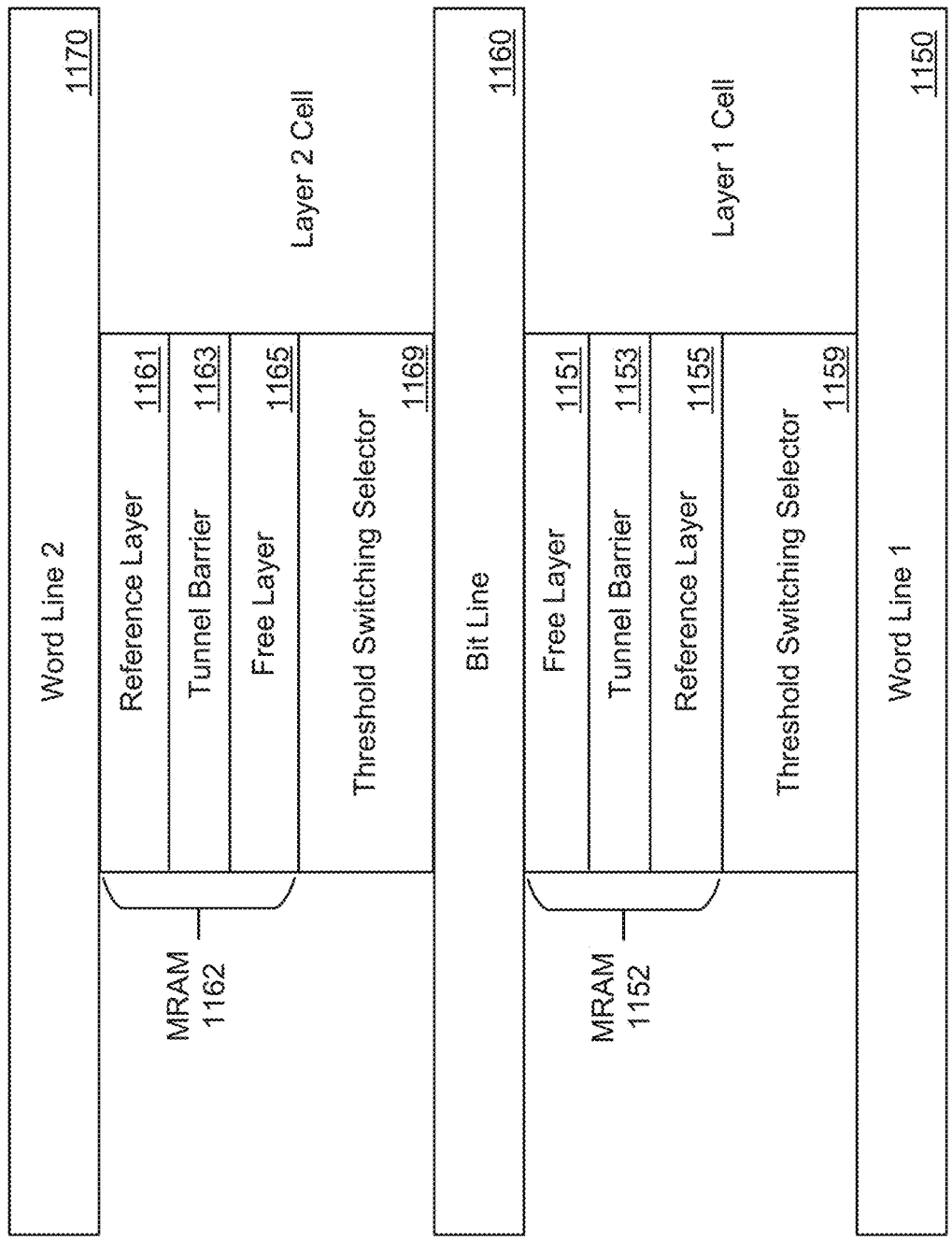

FIGS. 11A and 11B illustrate embodiments for the incorporation of threshold switching selectors into an MRAM memory array having a cross-point architecture. The examples of FIGS. 11A and 11B show two MRAM cells in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, by in a cross-point array they would be more accurately represented as represented in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM cell 1102 including free layer 1101, tunnel barrier 1103, and reference layer 1105 is formed above the threshold switching selector 1109, where this series combination of the MRAM device 1102 and the threshold switching selector 1109 together form the layer 1 cell between the bit line 1110 and word line 1 1100. The series combination of the MRAM device 1102 and the threshold switching selector 1109 operate as largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage $V_{th}$ of the threshold switching selector 1109, and then the biasing current or voltage needs to be maintained high enough above the holding current or holding voltage of the threshold switching selector 1109 so that it stays on during the subsequent read or write operation.

On the second layer, an MRAM cell 1112 includes free layer 1111, tunnel barrier 1113, and reference layer 1115 is formed above the threshold switching selector 1119, with the series combination of the MRAM device 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120.

In the embodiment of FIG. 11A, the threshold switching selector 1109/1119 is formed below the MRAM device 1102/1112, but in alternate embodiments the threshold switching selector can be formed above the MRAM device for one or both layers. As discussed with respect to FIGS. 10A and 10B, the MRAM memory cell is directional. In FIG. 11A, the MRAM devices 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM structure 1152 having a free layer 1151 formed over tunnel barrier 1153, that is turn formed over the reference layer 1155, with the MRAM structure 1152 formed over the threshold switching selector 1159. The second layer of the embodiment of FIG. 11B again has an MRAM device 1162 formed over a threshold switching selector 1169 between the bit line 1160 and word line 2 1170, but, relative to FIG. 11A, with the MRAM device 1162 inverted, having the reference layer 1161 now formed above the tunnel barrier 1163 and the free layer 1165 now under the tunnel barrier 1163.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level.

Figure 12:
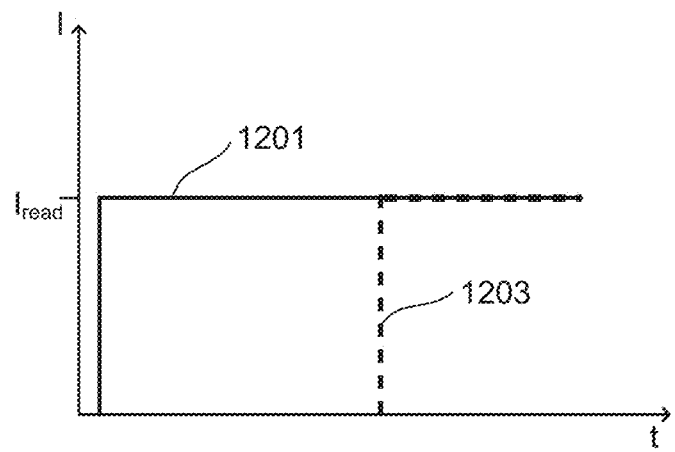
FIGS. 12 and 13 are an embodiment of a set of waveforms respectively for the current and the voltage for the layer 1 cell of FIGS. 11A and 11B in a read operation.
Figure 13:
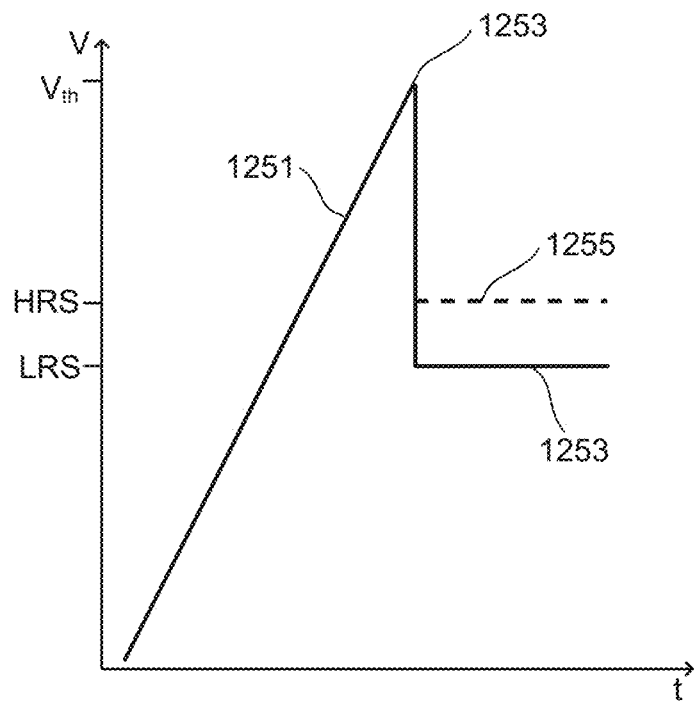

To either read data from or write of data to an MRAM memory cell involves passing a current through the memory cell. In embodiments where a threshold switching selector is placed in series with the MRAM device, before the current can pass through the MRAM device the threshold switching selector needs to be turned on by applying a sufficient voltage across the series combination of the threshold switching selector and the MRAM device. FIGS. 12 and 13 consider this activation of the threshold switching selector in more detail in the context of a read operation.

FIGS. 12 and 13 are an embodiment of a set of waveforms respectively for the current and the voltage for the layer 1 cell of FIGS. 11A and 11B in a read operation, where the time axes of FIGS. 12 and 13 are aligned and at the same scale. In this embodiment for a read operation the read is performed in the P2AP direction in which word line 1 1100/1150 is biased high and the bit line 1110/1160 is set low (e.g., 0V) so that the (conventional) current flows upward, passing through the reference layer 1105/1155 before passing through the free layer 1101/1151. (In terms of electron current, as opposed to conventional current, the electron flow will be as illustrated in FIG. 10B.)

In the embodiment of FIGS. 12 and 13, a forced current approach is used, with the memory driven from the reference layer side with a read current, $I_{read}$ from a current source in the driver circuitry for the line. As shown FIG. 12 by the solid line 1201, the current is raised to the $I_{read}$ value and held there for the duration of the current read operation. This current will move the lines supplying the current to the selected memory cell, such as word line 1 1100/1150 for the layer 1 memory cell in FIGS. 11A/B, and also support any leakage in the path. As shown at 1251 in FIG. 13, the current across the parallel combination of the threshold switching selector and the resistive MRAM element ramps up as the threshold switching selector is in an off state. Once the voltage across threshold switching selector reaches the threshold voltage $V_{th}$ of the threshold switching selector at 1253, it will turn on and switch to a low resistance state.

Once the threshold switching selector is in the on state, the $I_{read}$ current will flow through the selected memory cell. This is illustrated by the broken line 1203 of FIG. 12 that resents the current through memory cell, jumping from zero to $I_{read}$ when the threshold switching selector switches on at 1253. As the current level is held fixed at $I_{read}$, the voltage across the memory cell will drop to a level dependent upon the series resistance of the MRAM device and the on-state resistance of the threshold switching selector. For a binary embodiment, the memory cell will have a high resistance anti-parallel state and a low resistance parallel state. The resultant voltage across the series connected MRAM device and threshold switching selector and series decode transistors directing the current into 1 of N word lines and 1 of N bit lines in response to the $I_{read}$ current for the high resistance state (HRS) and low resistance state (LRS) are respectively shown as 1255 and 1253. The resultant voltage difference can then be measured by a sense amplifier to determine the data state stored in the memory cell. Although the discussion here is in the context of an MRAM based memory cell being placed in series with the threshold switching selector, this read technique can similarly be applied to other programmable resistance memory cells, such as PCM, FeRAM, or ReRAM devices, and other access devices, such as thresholding selectors, diodes, and transistors.

FIG. 13 shows the voltage applied to the ramping up at 1251 until it reaches $V_{th}$ at 1253, then dropping down to either the high resistance state level at 1255 or the low resistance state at 1253. In an actual device, due resistance and capacitances, there will be some delay as the voltage spike at 1253 drops down to either 1255 or 1253. This is illustrated by FIG. 14 for the example of a low resistance state.

Figure 14:
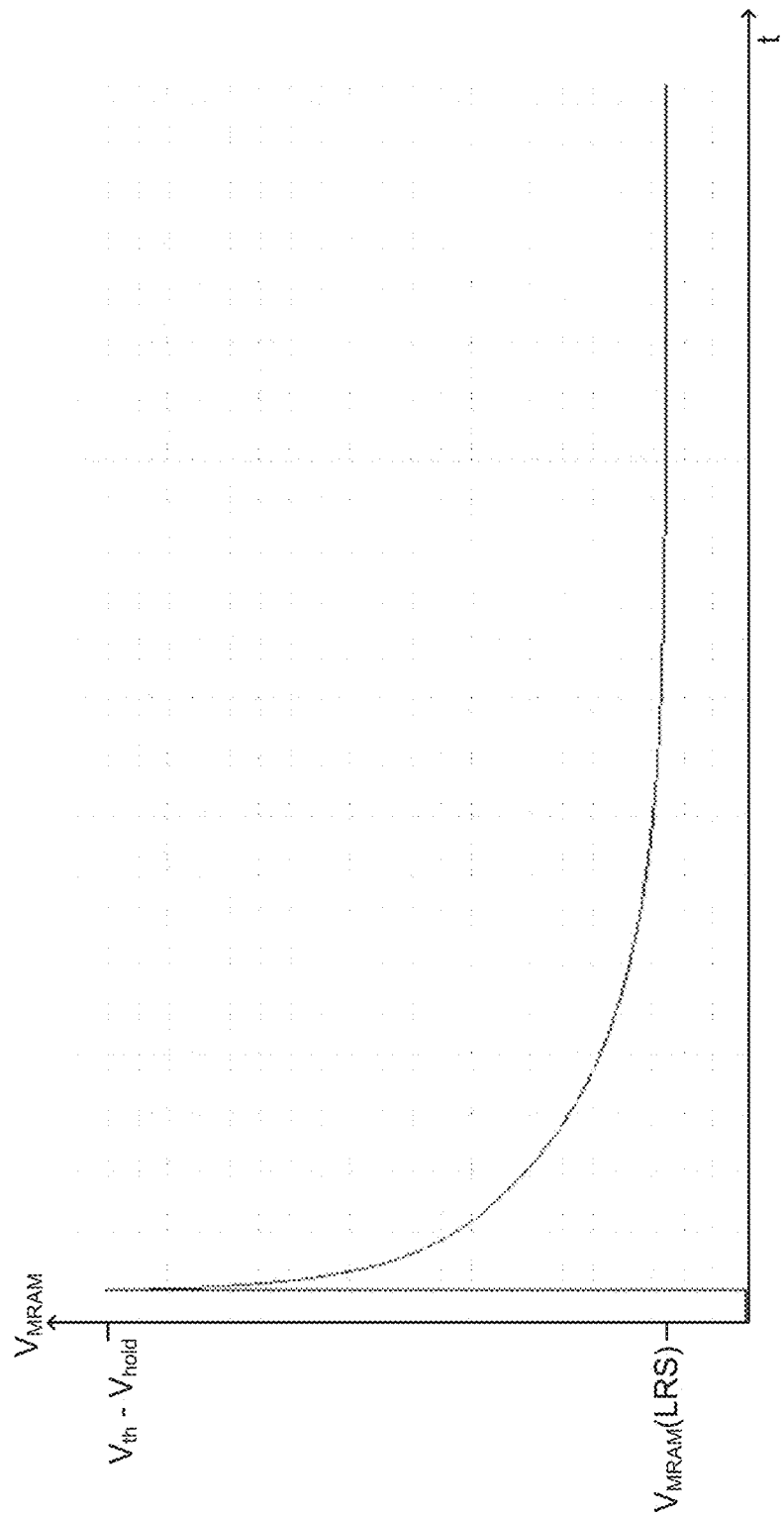
FIG. 14 shows an example of the voltage the MRAM device as the threshold switching selector switches from an off state to an on state.

FIG. 14 shows an example of the voltage across the MRAM device as the threshold switching selector switches from an off state to an on state. Relative to FIG. 13, FIG. 14 shows the voltage $V_{MRAM}$ across just the MRAM device, while FIG. 13 represents the voltage across the series combination of the threshold switching selector and the MRAM device. Initially, before the threshold switching selector turns on, the voltage across the MRAM device will be zero as the applied voltage ramps up to the $V_{th}$ voltage. Once the threshold switching selector turns on, current begins to flow through the MRAM device and the voltage across the MRAM device will spike to the $V_{th}$ level, less the voltage $V_{hold}$ dropped across the threshold switching selector. Consequently, $V_{MRAM}$ will jump from 0V to $\Delta V=(V_{th}-V_{hold})$, after which it will decay down the voltage drop across the MRAM device in the low resistance state in response to the applied $I_{read}$, $V_{MRAM}(LRS)$.

The rate at which the $V_{MRAM}$ voltage drops down to near the asymptotic $V_{MRAM}(LRS)$ level depends on size of the spike from the "snapback voltage" $\Delta V$, which is the difference between $(V_{th}-V_{hold})$ and $V_{MRAM}(LRS)$, and the rate at which charge can flow out of the device, which depends upon the internal resistance of the MRAM and selector when selector is turned on, the R-C characteristics of the memory cell and the lines between which it is connected between. Dissipation is faster for lower capacitance and lower resistance. This behavior has some practical consequences for the operation of the memory cell.

A first consequence is that both the low resistance state and the high resistance state will decay as shown in FIG. 14, where FIG. 14 shows the low resistances state. The high resistance state will show similar behavior, but with a higher asymptotic state Vfinal determined by the path resistance× the Iread. In order to distinguish between these two states, they need to be separated by a sufficient margin, so that a sensing operation cannot be performed until after enough time has passed in order for the two states to have well-defined and differentiable voltage levels.

Another consequence is that spike can disturb the data stored in the memory cell. As discussed with respect to FIGS. 10A and 10B, the state of an MRAM memory can be changed by passing a current through the memory cell, so that if the voltage across and/or current through a memory cell is high enough for long enough, it will, depending on the current's direction, change a parallel state to an anti-parallel state (a P2AP write), as illustrated in FIG. 10B, or change an anti-parallel state to a parallel state (an AP2P write), as illustrated in FIG. 10A. For example, the read process of FIGS. 12 and 13 is described as performed in the P2AP direction, so that a disturb by the waveform of FIG. 14 could switch a low resistance state memory cell to the high resistance state before the data state can be stored.

As noted above, the threshold switching selector controls access to the memory cells. In particular, to apply a voltage or current to a memory cell to change its resistance state, the corresponding selector must first be switched to a conductive state by applying a sufficiently high voltage, e.g., a voltage which is higher in magnitude than the operating threshold voltage $V_{th}$. When the selector is in a non-conductive state, e.g., when a voltage across the selector is lower in magnitude than the operating threshold voltage, the memory cell is isolated and retains its existing resistance state.

The threshold voltage $V_{th}$ and holding voltage $V_{hold}$ of a threshold switching selector depends on both intrinsic and extrinsic properties of the selector, including selector material composition, thickness, electrode composition, selector liner materials, heat sinking, and cycling history. Chalcogenide selectors comprised of binary, tertiary, or quarternary alloys of Ge, Se, Te, and As, and doped with B, C, Si, N, O, Zn, and/or In can have threshold voltages ranging from 0.5 to 6V and holding voltages of 0.5-3V. The exact voltages will depend on thickness with thicker selectors generally having higher threshold voltages and possibly slightly higher offset voltages. The higher the $V_{th}$ value of a threshold switching selector, the more effective its off state, but larger the spike as illustrated in FIG. 13. Consequently, the choice of the selector design is a decision based on the particular memory application to which it will be applied.

One characteristic of materials for threshold switching selectors, such as ovonic threshold switches, is that the threshold value voltage, $V_{th}$, of the material can drift over time, becoming higher as the devices ages or, more particularly, based on the time since the threshold switching selector has last been turned on. $V_{th}$ drift can cause problems such as increased error rate and reduced endurance since it requires a higher voltage be applied to turn on the threshold switching selector. If $V_{th}$ becomes too high, the memory device circuitry might be unable to generate the voltage and current required to turn-on the selector cell on. Even if the memory device is able to turn on the threshold switching selector, this results in the voltage spike of FIG. 13 being larger, which can increase the likelihood of a data disturb or damage to the resistive memory cell.

The following discussion presents techniques for power off recovery for memory devices that use a threshold switching selector in series with a resistive memory element. Although presented in the context of an MRAM based cross-point memory structure, since it is the properties of threshold switching selectors that are of concern, the techniques can be more generally applied to other memory cells in which a non-volatile element, such as resistive PCM or ReRAM, is in series with a threshold switching selector. Thus, the disclosed techniques are suitable for use in any form of cross-point array where the memory cells are connected between orthogonal layer of conducting lines (e.g., Tungsten or Copper wires).

As discussed above, a series connected threshold switching selector, such as an ovonic threshold switch, has a voltage $V_{th}$ that, when applied across the selector, switches it to a lower $V_{hold}$ voltage for a selected memory cell. In practice, when used in an actual memory device, the values can vary with the processing involved in forming the device, so that on a given device $V_{th}$ range varies with processing from, for example, 1.6V to 2.5 V. The $V_{th}$ value may increase over time due to "drift", such as 10 to 50 mV per decade of time. Consequently, drift of the $V_{th}$ values could further increase $V_{th}$ variation by 500 mV across 10 decades of time, perhaps raising the higher $V_{th}$ values to 3.0 V, for example.

Although the $V_{th}$ may in some cases drift due to general aging or wear, the amount of drift is mainly based on the time since the memory cell was last activated and the threshold switching selector turned on. When the device is in use and powered on, techniques such as "wear leveling" algorithms can access each memory cell within a period of time, such as 10 hours. Through such mechanisms, $V_{th}$ drift can be limited during operation, but such active management of drift is not possible during power off, which can be as long as several years.

The maximum value of $V_{th}$ that can be handled is limited by the available power supply on the memory device. If there is excessive $V_{th}$ drift during a device's power-off, the $V_{th}$ can exceed the voltage that the device can apply to the memory cell, which would be the power supply level minus any loss in the path to the memory cell (i.e., any leakage current times the path resistance). To overcome this, the available power supply level could be increased temporarily during power up to assure the memory cell selects and $V_{th}$ resets. However, this can require the introduction of circuitry, such as charge pumps and additional regulation circuitry, that would otherwise not be available on the memory device, using up area and increasing complexity and power consumption.

Even if the needed voltage is available, any increase in $V_{th}$ of the threshold switching selector increases the "snapback" voltage, $\Delta V=(V_{th}-V_{hold})$, upon turn-on, and this spike (as illustrated in FIG. 14) is imposed across the series connected MRAM device (or, more generally, other memory device connected in series with the threshold switching selector). The increase in $\Delta V$ due to a higher maximum $V_{th}$ can increase the probability that the bit stored in the MRAM memory cell switches before the level is stored upon selection for read. For example, reading the series connected MRAM and threshold switching selector in the write to AP direction (P2AP) risks a bit switching from P to AP, whereas a bit already in the AP state is "safe". As either bit state is possible at the start of read, if the $\Delta V$ is too large, the data content of the MRAM device could be lost by the induced transient, producing an unrecoverable corruption of stored user data. The mechanism may be different, but other forms of memory technology (ReRAM, PCM, and so on) used with a threshold switching selector can similarly experience a data disturb or damage from such large transients.

If data is stored in the device and then power is turned off, the device time before power-on and access of all bits can exceed the "power on" time of, for example, 10 hours between bit accesses in normal operations. Such time be accesses of all bits during power on may be assured, for example, by wear leveling where each bit accessed with a certain time and/or relocated. Expectations of embedded non-volatile memory (eNVM) for shelf life data retention without power-on can range out to 10 years. If the $V_{th}$ drifts excessively because the device is specified at 3 months, but the customer stores the device for longer without power, the device's data may need to be reloaded from storage instead of used directly from memory (e.g., "instant on"). Therefore, the challenge is to decide whether the $V_{th}$ drift has exceeded an allowed maximum value for $V_{th}$ and to decide whether to rely on the data stored in memory or reload.

Figure 16:
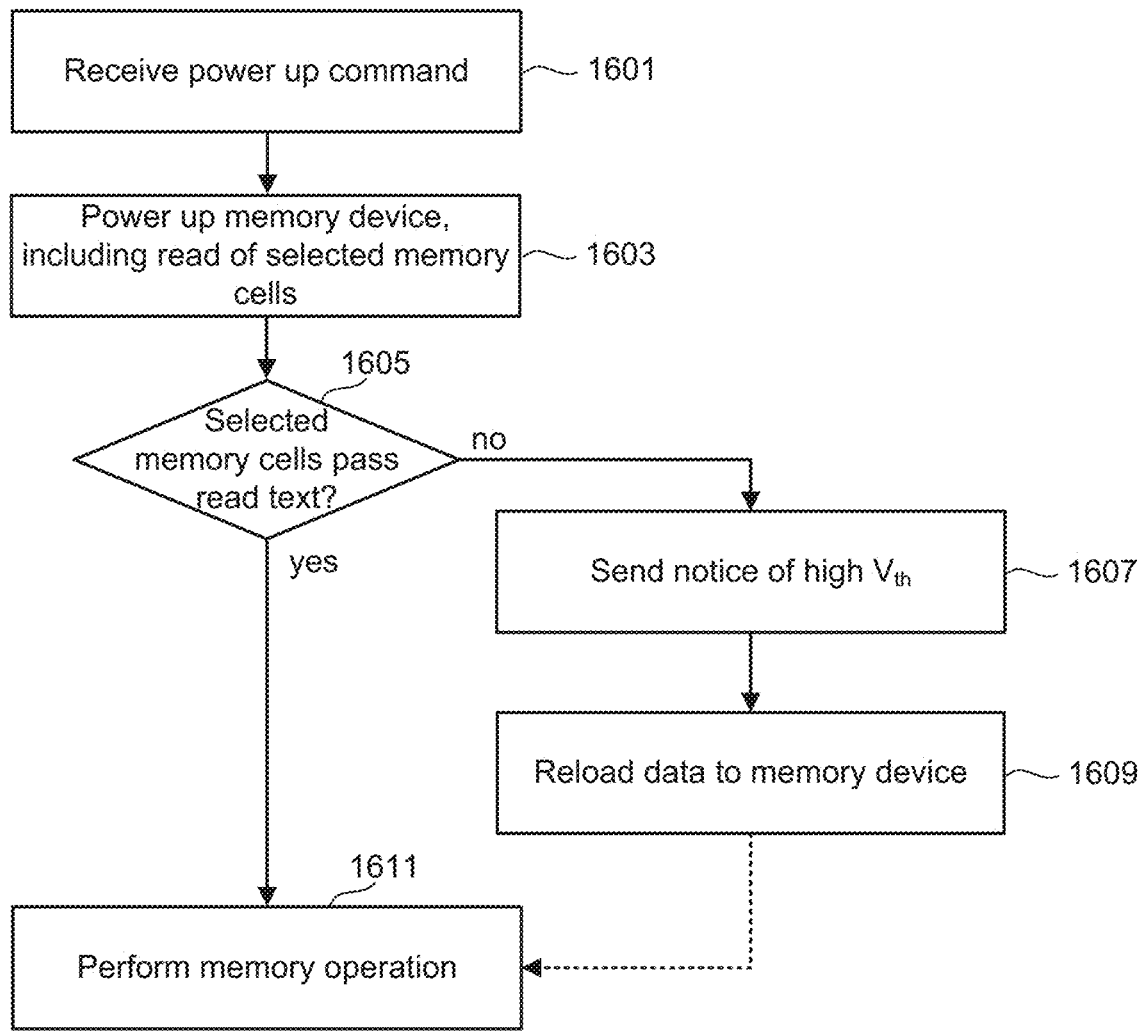
FIGS. 16-18 provide more detailed embodiments for the flow of FIG. 15.
Figure 17:
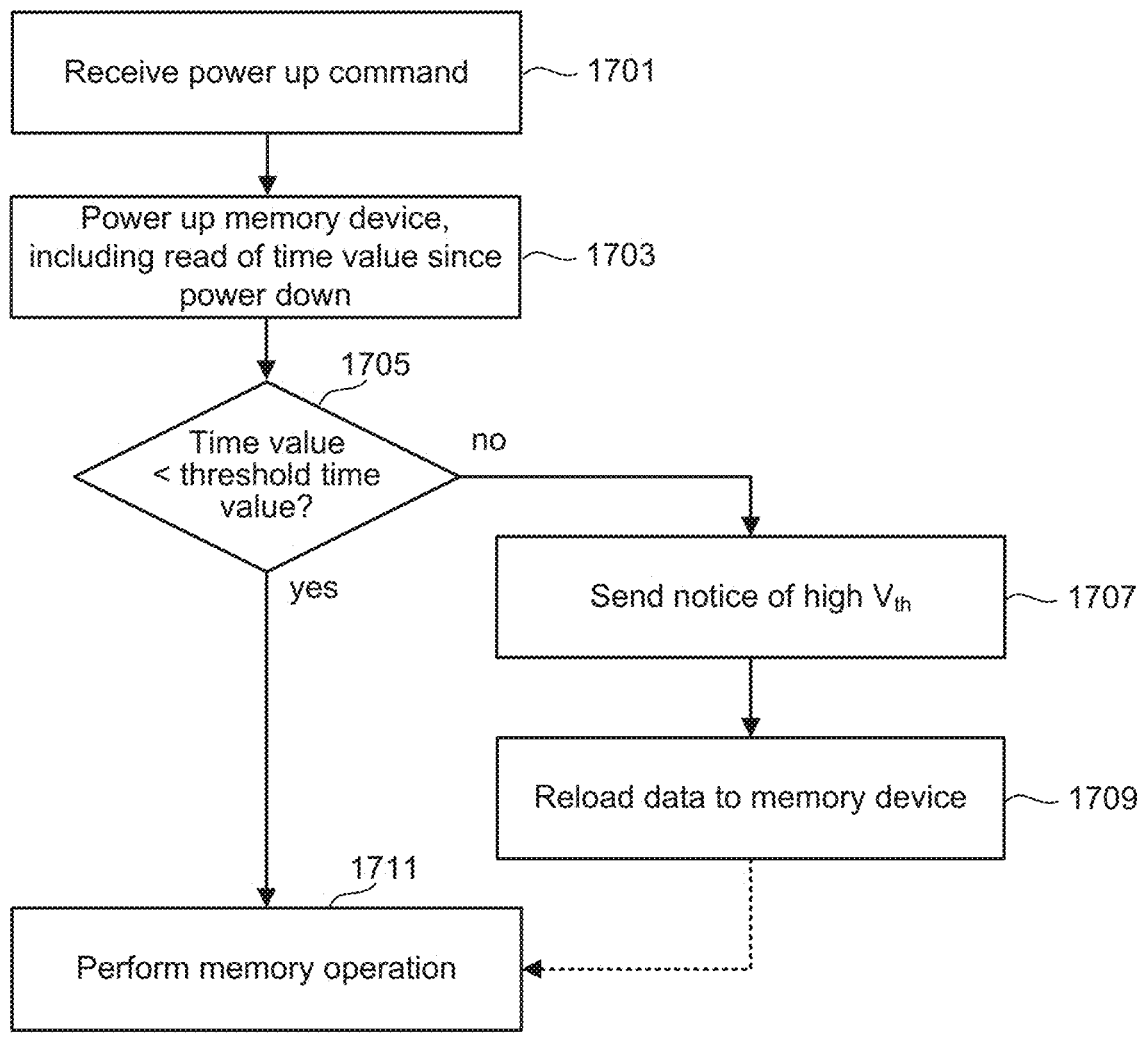
Figure 18:
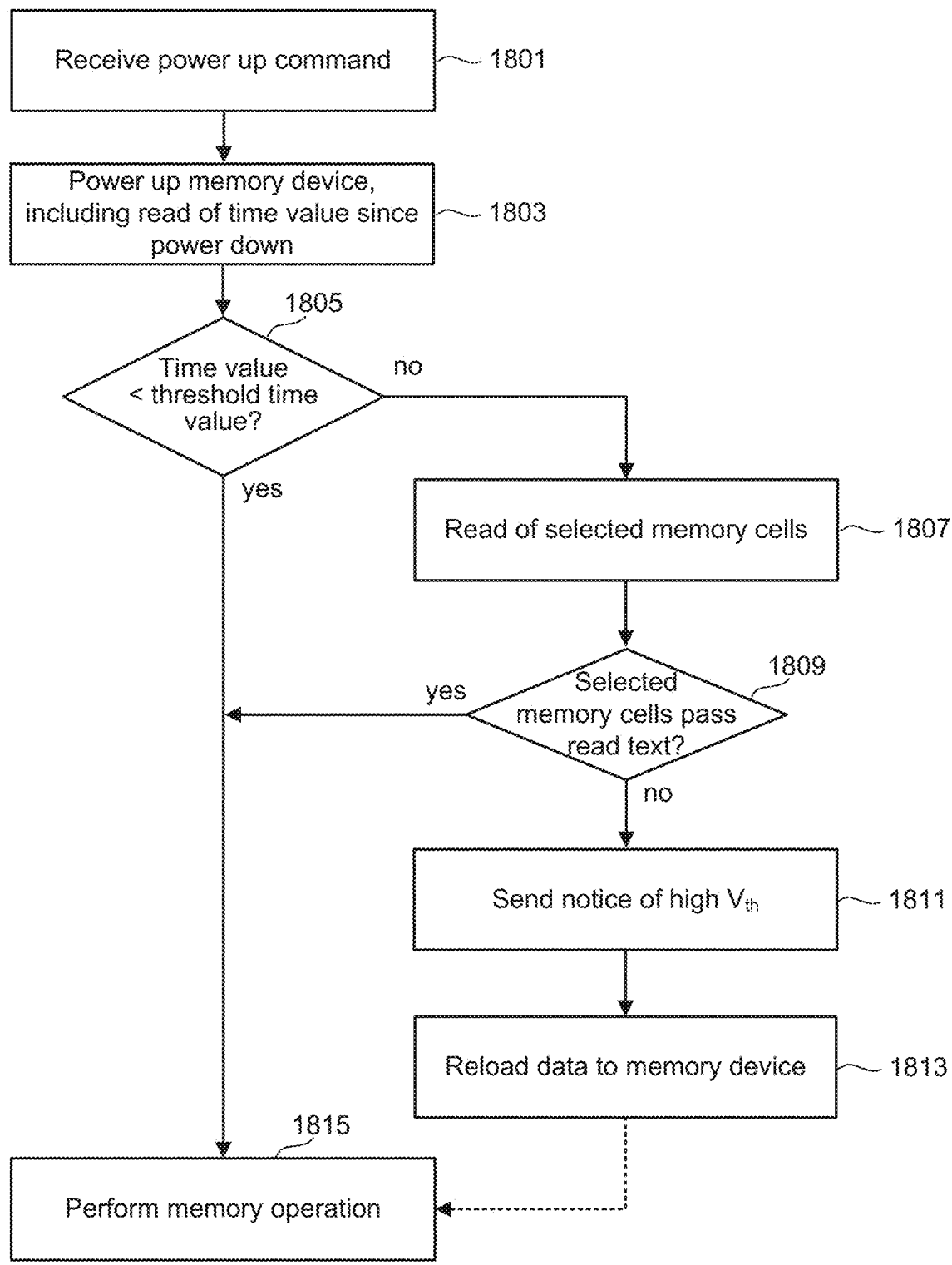

FIG. 15 is a high level flowchart of one embodiment for determining whether the $V_{th}$ of the threshold switching selector may have drifted to too high a value and that the data should be reloaded into the memory device. FIGS. 16-18 provide more detailed presentations of embodiments. In the flow of FIG. 15, the process is for the operation of the memory device that has previously been programmed and in operation, and is then powered down.

At step 1501, the memory device is powered down. This can be part of a proper shutdown, which can be in response to a command from the control circuity of the system such as from the system control logic 560/660, from controller 102, or host 120, or be an improper shutdown due to power loss. If the power down is a proper shutdown, in some embodiments a time value for the power down can be saved in register, such as register 561/661 or a register in controller 102. For some embodiments system control logic 560/660 can maintain and regularly update a time stamp, which can be referred to in case of either a proper or improper shutdown.

At some subsequent time, the device is powered up at step 1503, where the power up command can come from the system control logic 560/660, from controller 102, or host 120, such as part of an access request. As part of the power up procedure, step 1505 determines whether $V_{th}$ values of the threshold switching selectors is likely to have drifted to too high a value. Depending on the embodiment, the $V_{th}$ can be inferred through a test process, by tracking the time off for the device, or a combination of these, where these are respectively illustrated further by FIGS. 16, 17, and 18. If step 1505 determines that the $V_{th}$ values do not look to have drifted too far, if the device was powered up in order to perform a read or other operation, this operation can be performed at step 1507.

If step determines that the $V_{th}$ values have excessive drift, remedial action, such as reloading the data stored in the device, is taken at step 1509 before the operation of 1507 can be executed. The path from step 1509 is shown as a broken line as, in some embodiments, the operation may be cancelled due to the time needed for a data reload. The device can also send the controller 102 or host 120 a notification that the data should be reloaded. In some embodiments, the data can be reloaded from outside of the device, such as from other non-volatile location on the memory system or from a host serving as backup, for example from HDD or SSD. For example, if the MRAM cross-point memory is used as the local memory 106 used by the controller 102, the data may also be stored in mass storage memory, such as the memory packages 104, of the memory system, from where it can be reloaded. In other cases, where data is stored redundantly (as in a RAID arrangement), data on one device within the memory packages 104 can be replaced from other locations within the memory packages 104. In other cases, the data stored on the memory device may be able to be recovered and scrubbed, so that if data can be read, even with a high number of disturbs, the data content may be recoverable through the controller's ECC capability and rewritten to the memory device.

In one set of embodiments the threshold voltages of the threshold switching selectors is inferred as a test process during power up to determine if the drift is excessive. In the test process, a subset of the memory cells is read (or attempted to be read). The feasibility of this test depends on whether the memory interface allows a power on delay upon re-start that is long enough to conduct the test. One test is a simple turn-on detection test using the same selection circuitry of row control circuitry 520/620 and column control circuitry 510/610 that selects a memory cell in the memory array or arrays ("tiles") of 502/602 in FIGS. 5-6B. Due to resistance in the wire connecting the memory cells to the array drivers 524/624 of the row control circuitry 520/620 to drive word lines and the driver circuitry 514/614 of the column control circuitry 510/610 to drive the bit lines, the voltage seen at the memory cell will differ from the voltage provided by the drivers by an amount that depends on the memory cells location. To account for this, in some embodiments the turn-on detection test can replicating this effect by accessing the "far far" memory cells that are furthest along the wire resistances (for example, the upper left corner of array 602 as represented in FIG. 6B) to maximize any I-R voltage drop that might be seen on an array. If the memory cell turns on, the decision can be that $V_{th}$ is not excessive.

In an alternate read test process during power up, a dedicated programmed code words (256 bit or longer) that is maintained to have a known set of values during operation can be stored in a memory array. During power up, the known, dedicated code word can be read out and the values, as read, can be compared to the known values as stored to determine the number of bit errors. If the number of bit errors exceeds a given target (e.g., 1%), the drift is determined to be excessive. For either power-up read test, to better assure worst-case is tested, both tests can be run at an adequately lower power supply voltage to assure detection of excessive drift. If the array fails the $V_{th}$ read test at the lower level, one possible remedial action can be to then read the memory with a higher voltage to see whether the data content can be extracted and scrubbed.

FIG. 16 is flowchart of one embodiment for determining excessive $V_{th}$ drift by use of a read test as part of the power up process. At step 1601 a power on command is received by the memory device, such as the memory device 500 of FIG. 5 or the memory die 601 or memory system 600 of FIGS. 6A and 6B. The power up command can come from the system control logic 560/660, from controller 102, or host 120, depending on the level at which the preceding power-down occurred.

At step 1603 the power up sequence begins. In addition to the usual operations involved, a read test on a selected subset of the memory cells is performed to determine whether there has been substantial $V_{th}$ drift while the device was powered down. The read test can be performed as in the examples described above, such as reading a word line or bit line from one or more arrays on the device, such by accessing the "far far" memory cells that are furthest from the drivers 524/624 and 514/614 along the conducting lines connecting the memory cells to the access circuitry, or such as by reading out a set of memory cells that store a known pattern of data for this purpose. To ensure sufficient operating margins, for any of these read tests, the test can be performed using read voltage and/or current levels from the array drivers 524/624 and driver circuitry 514/614 that are reduced relative to the levels used in a standard data access read operation. In some embodiments, if the reduced voltage and/or current is insufficient to turn on some or all of the threshold switching selectors, that standard read levels or even an elevated read level may be applied by the array drivers 524/624 and driver circuitry 514/614 to see whether this is sufficient to turn on the threshold switching selectors.

As discussed with respect to FIG. 13, it is possible for the threshold voltage of drifted threshold switching selectors to exceed the maximum voltage that is applied during the selection process. In this case a threshold switching selector will not turn during the data reloading process and the user data on the chip will be corrupted. To ensure that the drifted threshold switching selectors turn on, in some embodiments the maximum available voltage can be temporary increased. The maximum available voltage can be increased by increasing the voltage available to the row control circuitry 520/620, column control circuitry 510/610, or both during the turn-on ramp by the control circuits. If the available voltage is already limited by the supply voltage, the supply voltage can be temporarily increased through circuitry (e.g., regulators or charge pumps in power generation circuits in the system control logic 560/660). The higher available voltage is picked to ensure a sufficiently low failure rate of threshold switching selectors not turning on. For example, the increase in available voltage can range between 0.1-1.0 V. Once all of the threshold switching selectors on the memory die have been cycled with the higher voltage, the available voltage is returned back to the normal value used in a data read, and the data can be reloaded from storage. The need to cycle all selectors prior to data reload can be avoided if the data reload process cycles all of the selectors on the chip. The higher available supply voltage can allow higher gate voltages to be applied to transistors in row control circuitry 520/620 and column control circuitry 510/610, as well as higher source and drain voltages. Both have the effect of increasing the available voltage and current that can be supplied by the control circuitry to the cross-point array. If the selection process is performed by circuitry that is capable of sourcing a requested current rather than a requested voltage, the higher available voltage enables a higher current to be sourced, which in turn allows a higher voltage to be applied to the selected cell.

Step 1605 determines whether the device passes the test. The test can be performed by the system control logic 560/660, for example, while in other embodiments it can be performed at a higher level in the system. For example, if test involved decoding of ECC codewords, the test can be performed at the controller 102 in order to use the ECC engines 226/256. For a simple read operation, the test can just be to see if the subset of memory cells, or some threshold number of the subset, fail to turn on by detecting if current flows through the memory cell at either the low or high resistance level.

If the read test is for an embodiment that reads a set of memory cells storing a predetermined pattern, the test can be a comparison in the system control logic 560/660 to just compare the data as read with the data of the known pattern as stored. For example, the system control logic 560/660 could maintain a copy of the data pattern in the registers 561/661. The determination of step 1605 can then be based on whether the data as read matches the pattern, or matches within a threshold bit error rate.

If the memory array or arrays pass the $V_{th}$ read test at step 1605, the power up process can complete and the read, program, or other operation for which the array was powered up, can be executed at step 1611. If instead the test is not passed at step 1605, at step 1607 the system control logic 560/660 can notify the controller 102 and/or host 120 that there has likely been excessive $V_{th}$ drift. At step 1611 the data is then reloaded at step 1609, which can be performed as described above with respect to step 1509 of FIG. 15. Depending on embodiment, a number of variations are available at steps 1607 and 1609. For example, in response to the notification at step 1607, the controller 102 or the host 120 may instruct the memory 500/600 to go ahead and try to read or otherwise access the memory before, or instead of, reloading the data at step 1609. For example, if the test was performed using reduced read voltages and/or current levels, an access can be attempted at the standard or even raised level for the voltage and/or current levels. As the reload can take a large amount of time, the host 120 or controller 102 may decide to wait and continue with the access at step 1611 once the data is reloaded, or may decide to cancel the operation or access that data from a redundant storage location, if available. In some embodiments, the reload could be performed in a prioritized manner, where the data that was to be accessed is reloaded and provided to the host first, before reloading data at other addresses in what could be a background operation.

In another set of embodiments, a power off tracking approach can be used. In this approach, the controller 102, system, or (if not also powered down) control logic 560/660 can keep track of the time "off" or disabled by the device using its serial ID on-chip, such as by maintaining and regularly updating a time stamp, and thereby track the duration of the time-off to determine if the unpowered time is excessive. In other embodiments, the time at power off can be logged, such in the registers 561/661 on the system control logic 560/660 of memory device or at the level of the system or controller 102, and read as a mode register upon power up to determine if power-off time was excessive. If the time since the preceding power down exceeds some threshold value, such as 3 months for example, the controller 102, host 120, or system control logic 560/660 can determine whether the $V_{th}$ could have increased excessively, and decide to re-load the data instead of relying on the data as stored, since the data's bit error rate BER may increase excessively and not be recoverable unless re-loaded.

FIG. 17 is flowchart of one embodiment for determining whether there may be excessive $V_{th}$ drift by a power off tracking approach based upon the amount of time that memory device was powered down. Step 1701 can be largely the same as step 1601 of FIG. 16, as can the more typical portions of the power up sequence of step 1703. The step 1703 will differ from step 1603 in how the memory determines whether the $V_{th}$ values are likely to have drifted too much.

More specifically, in step 1703 a power off tracking approach is used. As discussed two paragraphs above, the controller 102, system, or (if not also powered down) control logic 560/660 can keep track of the time "off", by maintaining and regularly updating a time stamp or by logging, the time at power, such as by using the registers 561/661 or at the level of the system or controller 102, and read as a mode register upon power up to determine if power-off time was excessive. Step 1705 determines whether the device passes the test, where the test can be performed by the system control logic 560/660, for example, while in other embodiments it can be performed at a higher level in the system. In the embodiment of FIG. 17, the test is based on the time since the preceding power down and determining whether it exceeds some threshold value, such as 3 months for example. The controller 102, host 120, or system control logic 560/660 can determine whether the $V_{th}$, the value for the elapse time has exceeded a threshold at step 1705. Based on the result of step 1705, the flow can continue on to steps 1707, 1709, and 1711, which can be as described above with respect to steps 1607, 1609, and 1611 of FIG. 16.

FIG. 18 is flowchart of an embodiment that combines the approach of FIGS. 16 and 17. A memory system will sometimes have a specified amount of time allotted for a power procedure. The process of the FIG. 16 involves the reading of some portion of the memory cells on the array, which is typically more time consuming than determining the amount of time since the last time since the memory device was accessed. In the hybrid approach of FIG. 18, the time based approach of FIG. 17 is checked first and, if the elapsed time exceeds a threshold, a read-based test is performed.

In the flow of FIG. 18, steps 1801, 1803, and 1805 can be as described above with respect to steps 1701, 1703, and 1705, except that if the test of step 1805 is passed the flow goes to step 1815 (which can be as described above with respect to steps 1611 of FIG. 16 or step 1711 of FIG. 17), while if the test is not passed the flow goes to step 1807. A read-based test is performed in steps 1807 and 1809. A selected set of memory cells is read at step 1807, where this can be as discussed above with respect to this part of the power up sequence of step 1703 of FIG. 17. Step 1809 performs the read based test, which can be as described above with respect to step 1605 of FIG. 16. As discussed above, in some embodiment in response to determining that the threshold voltages of the threshold switching selectors have drifted to too high a value, the available voltage to turn on the threshold switching selectors is increased from a first maximum value to a second maximum value, all of the selectors on the memory die cycled, the available voltage to turn on the selectors is returned to the first maximum value, and data is reloaded into the array. If the test of step 1809 is passed, the flow can go to step 1815; if the test of step 1809 is not passed, the flow goes to step 1811 and 1813, which can be as described above with respective to steps 1607 and 1609 of FIG. 16.

The preceding discussion considered the situation when the threshold voltages of the threshold switching selectors may have drifted excessively, so that the memory cells can no longer be read accurately. In particular, techniques were presented for determining when the threshold voltages of the threshold switching selectors have become too high and, in response reloading the stored data with a copy of this data content, such as a redundant copy on the memory system, a copy from outside of the system, or a copy that is reconstructed, such as use of error correction codes. The following discussion looks at techniques for improving first fire (i.e., turning on to a conductive state for the first time for a fresh device) and cold start initialization operations of the threshold switching selectors to help reduces situations of excessive voltage threshold drift.

More specifically, the following looks at techniques for reducing bit error rates due to first fire and long term drift in cross-point memory technologies, such as cross-point MRAM and cross-point PCM memories, in which the memory cells are formed of a programmable resistive element connected in series with a threshold switching selector. Threshold switching selectors, such as Ovonic Threshold Switches (OTSs), allow for high density memory due to their low leakage and fast turn-on and recovery. As discussed above, the threshold voltage (Vth) of an OTS or other threshold switching selector, however, can be much higher on first fire or after a long time has elapsed since last fire. For example, the difference between Vth during normal operation and first fire can be 60% or more; and the Vth of a threshold switching selector that has not been fired will increase with time and the cold start value could be close to the first fire Vth if a very long time has elapsed. Initializing a cross-point memory in which a large difference in Vth values exists between non-initialized and initialized selectors is problematic, causing a high likelihood that the high Vth selectors will not be able to be fired during normal operation. To address this, a robust method is needed for initializing selectors during first fire and cold start.

For consistent operation, first fire and Vth draft effects of threshold switching selectors should be carefully managed. These effects can be considered further with respect to FIGS. 19A and 19B.

Figure 19A:
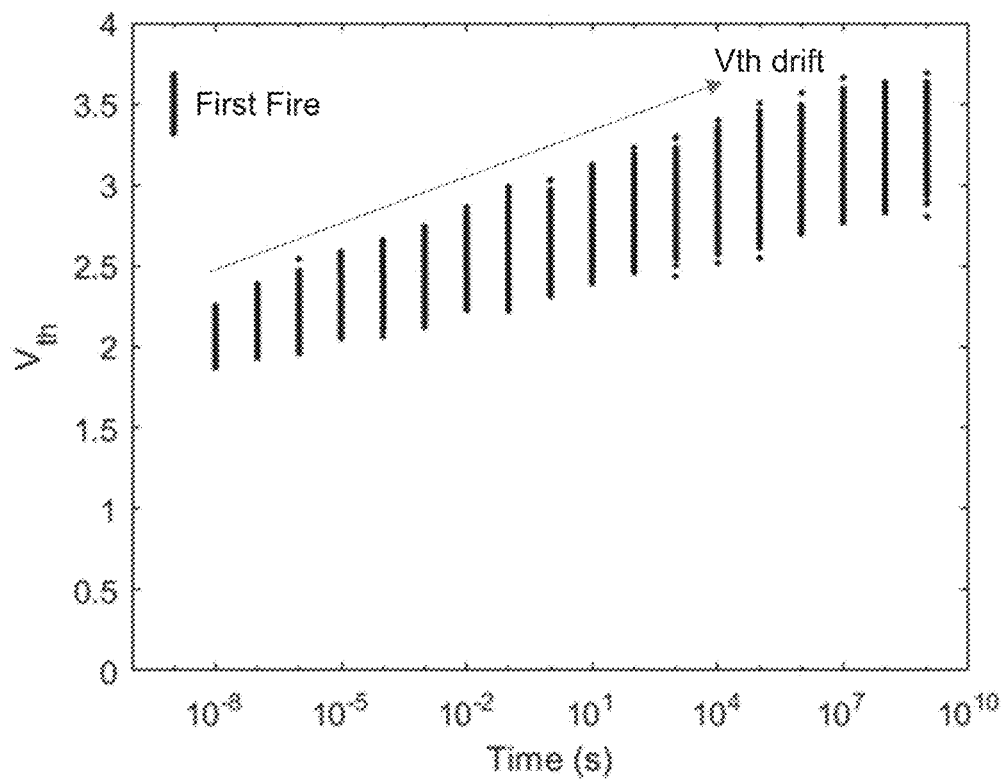
FIG. 19A is a plot of simulated Vth values versus time for a population of threshold switching selectors, showing both the first fire and Vth drift effects.

FIG. 19A is a plot of simulated Vth values (in volts) versus time (in a logarithmic scale in seconds) for a population of threshold switching selectors, showing both the first fire and Vth drift effects. The distribution of first fire Vth values is shown at left and corresponds to the Vth value of a threshold switching selector the first time that it is turned, such may be done as part of a testing or initialization process for the memory device prior to being supplied to customers or distributors. As such, the time axis does not really apply to the first fire distributions. The time scale is for the elapsed time since the previous time since the threshold switching selectors were turned on, with the simulated Vth ranges of a population shown at a number time values. As illustrated in FIG. 19A, the Vth value of a threshold switching selector when fresh out of a fabrication facility can be more than 50% higher than Vth immediately after fire. For example, in the simulation of FIG. 19A, the Vth distribution right after a previous use is centered around 2V, while the fresh fire distribution is centered at close to 3.5V.

Vth drift is illustrated to the right of the first fire distribution in FIG. 19A, with the Vth of the OTS or other threshold switching selector increasing with time. In the OTS example, the Vth drift is typically logarithmic in time, but is stochastic in nature, so that on average $V_{th} \sim \alpha \ast \log(t) + V_0$, where $V_0$ it the Vth value a device immediately after firing, but where the devices do not necessarily drift uniformly. As illustrated, if a memory cell has not been accessed for, say a few weeks or months, the Vth values can have drifted significantly and have a wide variance.

Figure 19B:
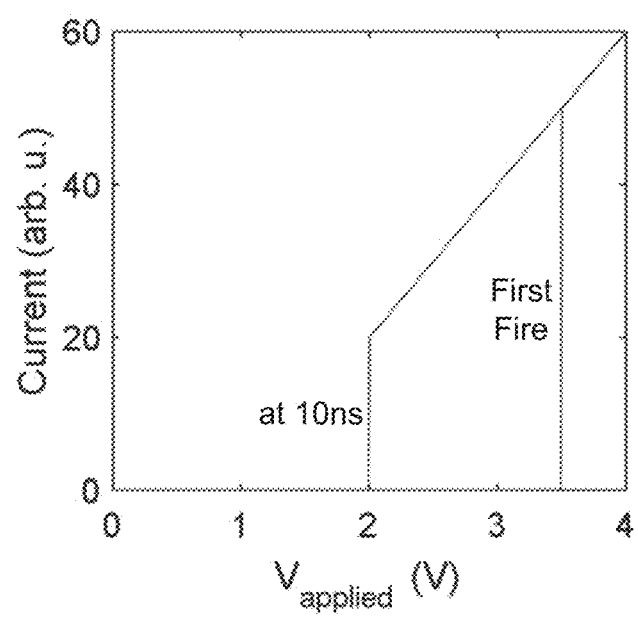
FIG. 19B is a current versus voltage diagram for a memory cell formed by a series combination of programmable resistance element in series with a threshold switching selector.

FIG. 19B is a current versus voltage diagram for a memory cell formed by a series combination of programmable resistance element in series with a threshold switching selector, wherein the voltage axis is in volts and the current axis in arbitrary units. As was discussed above, prior to the threshold switching selector firing (V<Vth), no current will flow though the memory cell; once the threshold switching selector turns on, the memory follows a linear, ohmic behavior. As illustrated, a recently accessed memory cell (e.g., 10 ns previously) might turn on at 2V, whereas as at first fire the threshold voltage may be 3.5V.

Figure 20:
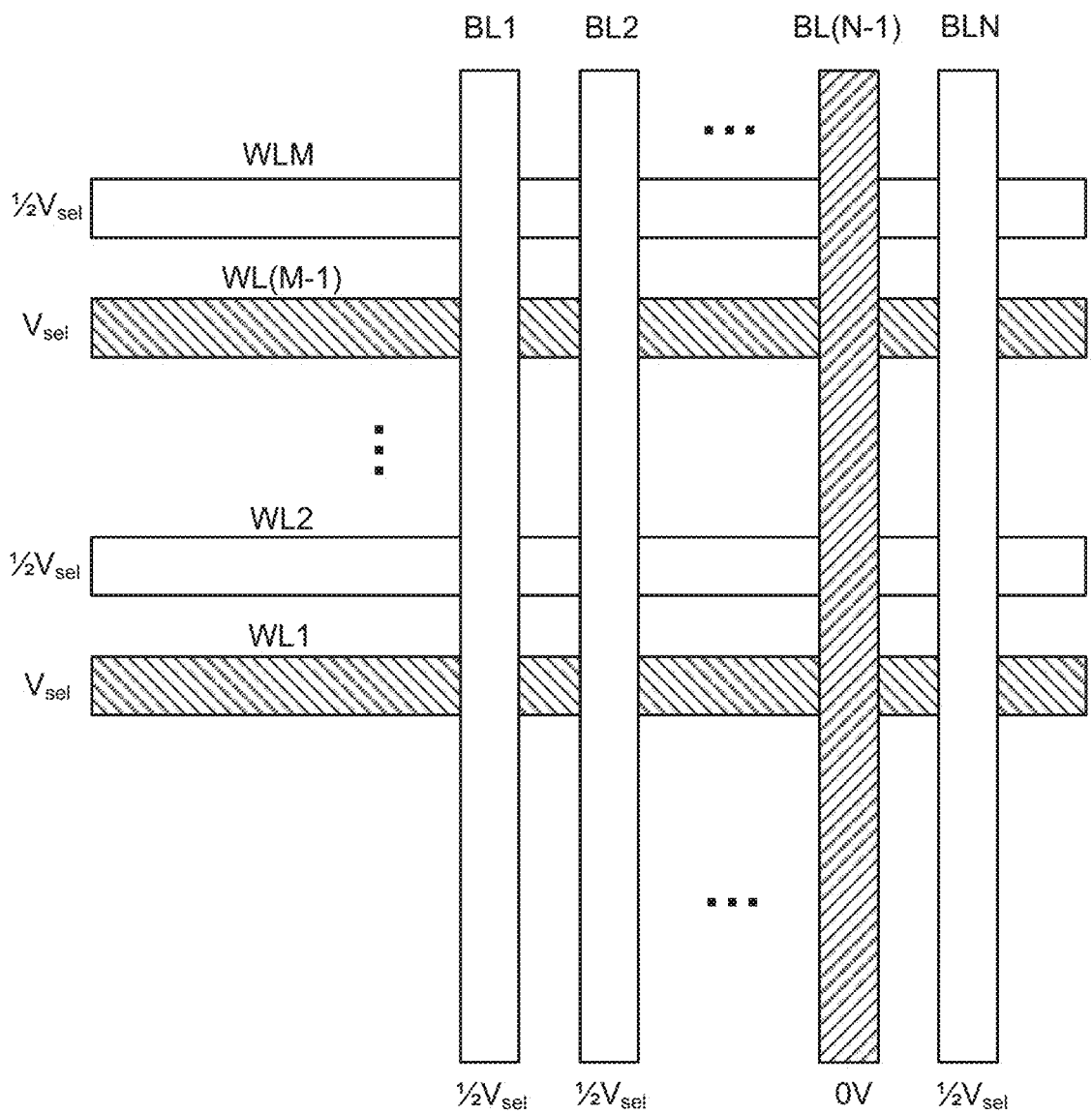
FIG. 20 illustrates a half-select scheme for selection of memory cells to be read or programmed.

The effects of Vth drift can have a significant effect on the operation of memory devices using a cross-point architecture, causing the Vth and array leakage to exceed design constraints for the array and for the CMOS and other control circuitry elements. Referring back to the cross-point structure illustrated in FIGS. 7A-7D, the number of each of the word lines and bit lines can be several thousand, resulting in millions or tens of millions of memory cells within each array. As described with respect to FIGS. 8-13, in a memory operation, such as a read or write, the selected memory cells are biased such that a current flows between the corresponding bit lines and word lines, while non-selected memory cells are biased to avoid current flowing. FIG. 20 illustrates the concept of a "half-select" operation of a cross-point memory array.

FIG. 20 illustrates a half-select scheme for selection of memory cells to be read or programmed. Voltages are applied to the top (bit lines) and bottom (word line) wires so that cells along a bit line that are intended to be accessed have a select voltage $V_{sel}$, such as a read or write voltage, applied across the memory cell between the bottom and top wires. Memory cells that are not to be written experience either only half of the voltage drop ($V_{sel}/2$) or no voltage drop. In the example of FIG. 20, the two cells at intersection of bit line $BL_{(N-1)}$ and word lines $WL_1$ and $WL_{(M-1)}$ are selected for writing, with write voltage $V_{sel}$ applied on the selected word lines and 0V (or, more generally, a lower voltage level) on the selected bit line. The other word lines and bit lines are set to ½ $V_{sel}$ (or, more generally, some other voltage level intermediate to the write voltage $V_{sel}$ and low voltage level on the selected word line such that the threshold switching selector of non-selected memory cells are turned on). This places a differential of $V_{sel}$ across the selected memory cells and either 0V or ½ $V_{sel}$ across non-selected memory cells.

The $V_{sel}$ level is selected such that the threshold switching selector turns on for a differential of $V_{sel}$, but not for a differential of ½ $V_{sel}$. In FIG. 20, the selected word lines are placed at the high voltage level of $V_{sel}$ and the selected bit lines placed at the low voltage level of 0V, such that current flows from a selected word line to a selected bit line, but the alternate polarity can be used. In particular, as described above with respect to FIGS. 10A and 10B, when the resistive element of the memory cell is formed according to an MRAM technology, the drivers for the word lines and bit lines are configured to apply currents with both pluralities in order to write the memory cells. Additionally, although FIG. 20 illustrates multiple selected word lines along single selected bit line, depending on the memory device architecture, multiple bit lines along a single word line or multiple word lines along a single bit line can be written or read (in a standard read operation) concurrently. (In applications where the memory array is applied to in-memory matrix multiplication, multiple word lines and multiple bit lines can be accessed concurrently). Depending on the orientation, programming and reading can be done sequentially on a bit line by bit line process or a word line by word line process.

In the embodiment of FIG. 20, both the non-selected word lines and the non-selected bit lines are set to a voltage intermediate to the $V_{sel}$ applied to the selected word lines and the low voltage of 0V applied to the selected bit line. In particular, ½ $V_{sel}$ is applied to all non-selected bit lines and word lines. However, other embodiments can use different values, using another value lower than $V_{sel}$ for non-selected word lines and another value greater than 0V for the non-selected bit lines.

Figure 21A:
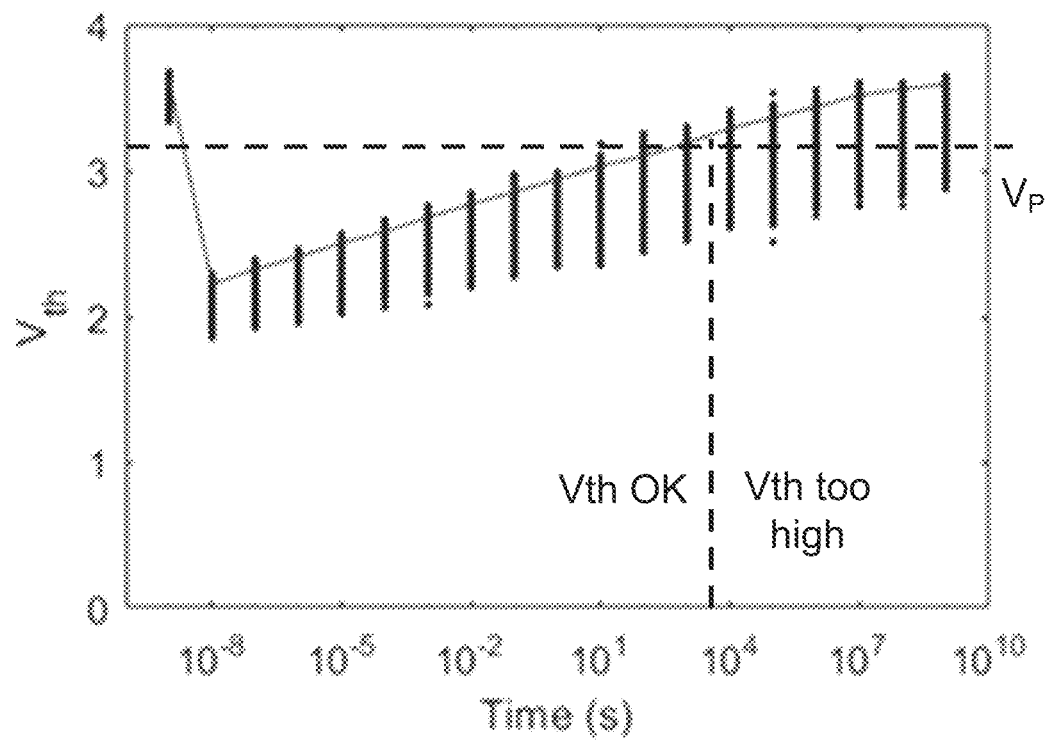
FIGS. 21A and 21B consider the behavior of Vth versus time and of leakage current versus time for a memory array with a cross-point architecture in the context of design constraints.
Figure 21B:
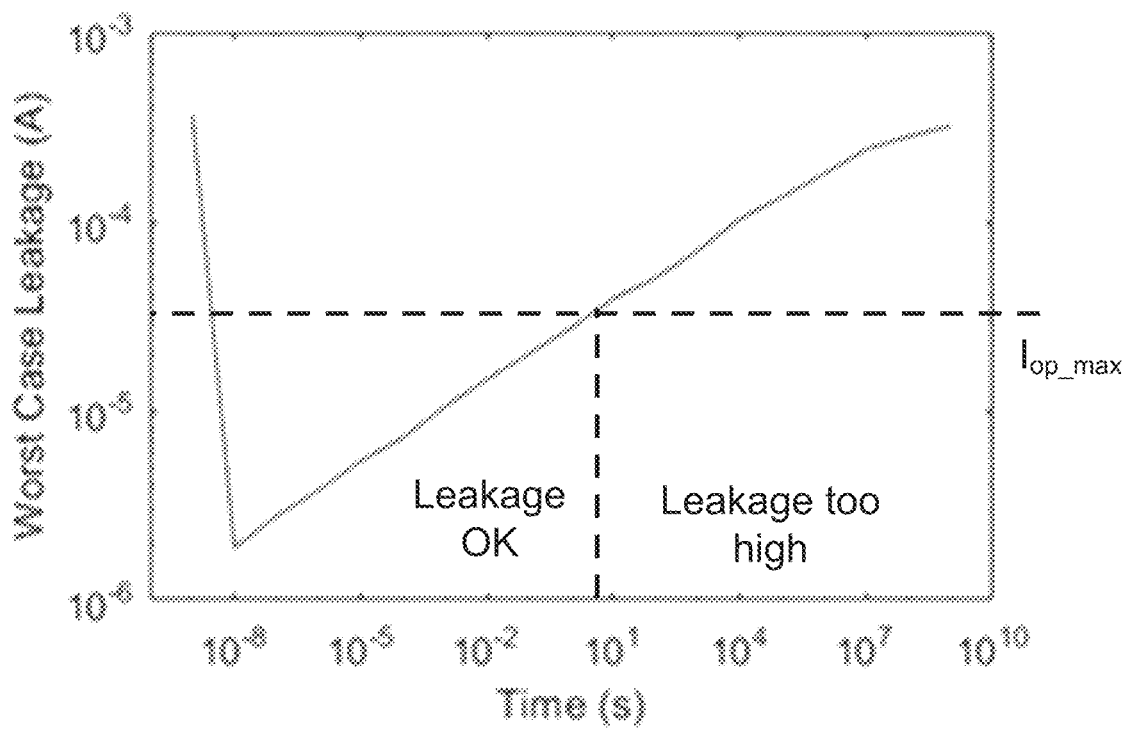

FIGS. 21A and 21B respectively consider the behavior of Vth versus time and of leakage current versus time for a memory array with a cross-point architecture in the context of design constraints. The first set of points before $10^{-8}$ s on the graph represent Vth and leakage at first fire. FIG. 21A presents the same simulation data as FIG. 19A, but also illustrates an example of the maximum available voltage Vp on the memory die. When a memory access has been performed recently, such as within less than $10^2$ or $10^3$ seconds, Vp is sufficient to turn all or all but a few of the memory cells' threshold voltage selectors, but as the time since the last access increases, more and more or the memory cells will not be accessible. Although memory system commonly incorporate ECC that can compensate for some number of non-accessible memory cells, at some point Vth becomes too high (~$10^5$ seconds in this example) and the data can no longer be accessed with the available Vp on the memory device. Although Vp could be increased, this would result in higher levels of power consumption, require additional control circuitry (such as charge pumps), lead to higher rates of disturbs (i.e., data overwrites), or various combinations of these and other problems. FIG. 21B illustrates an example of the worst case leakage current (i.e., cumulative unwanted current through all of the half select memory cells on the word line) from a memory array as a function of the time since the last access due to the drift in Vth values. As the Vth values drifts to higher values, the leakage current increases and can eventually become higher than the ability of the control circuitry to provide sufficient current. To prevent selection or bit errors, Vth needs to be below the supply voltage and leakage needs to be within operational constraints for the non-selected elements of the cross-point array. Refresh operations can be used to manage Vth drift during device operation, but first fire and cold start (which can have Vth levels similar to cold start when a device has been turned off for ~1 year) need to special procedures to manage.

Although first fire Vth and Vth drift can, to some degree, be reduced though threshold switching selector materials and process improvements, these effect are still found to be present in such devices. Additionally, the material changes that reduce first fire and drift could come at the expense of undesired changes to other threshold switching selector properties like leakage or endurance. Refresh operations can be used to help keep Vth within an acceptable range, but refresh can only be used when the chip is turned on. Raising the available Vp voltage level and improving the CMOS current supply capability to tolerate higher leakage can also address these problems, but at the undesirable costs of increased chip area and power consumption.

To address the first fire and Vth drift problem while avoiding these limitations, the following presents a non-half select scheme for first fire and cold start initialization of memory cells using a threshold selector switches in a cross-point architecture. More specifically, first fire and cold start initialization is enabled by reducing first fire and cold start leakage by optimizing half-select voltage and polarity. In one set of embodiments, when the high voltage is applied to selected word lines the unselected bit line voltage ($V_{BL}$) is increased to be closer to the selected word line voltage (e.g., the high supply voltage level ~$V_P$); and the unselected word line voltage ($V_{WL}$) is decreased to be closer to the selected bit line voltage (e.g., the supply low or ground voltage level, ~0V). By optimizing the unselect voltages, the leakage currents that the select transistors need to supply to an array of memory cells can be greatly reduced. The lower leakage allows initialization of high Vth selectors that would have overwhelmed the current capability of the transistors. Additionally, one or more polarities can be chosen to initialize the threshold switching selector, as the threshold switching selectors can have first fire or Vth voltage levels that can be lower in one polarity than the other, making it easier to initialize with the lower Vth polarity.

Figure 22:
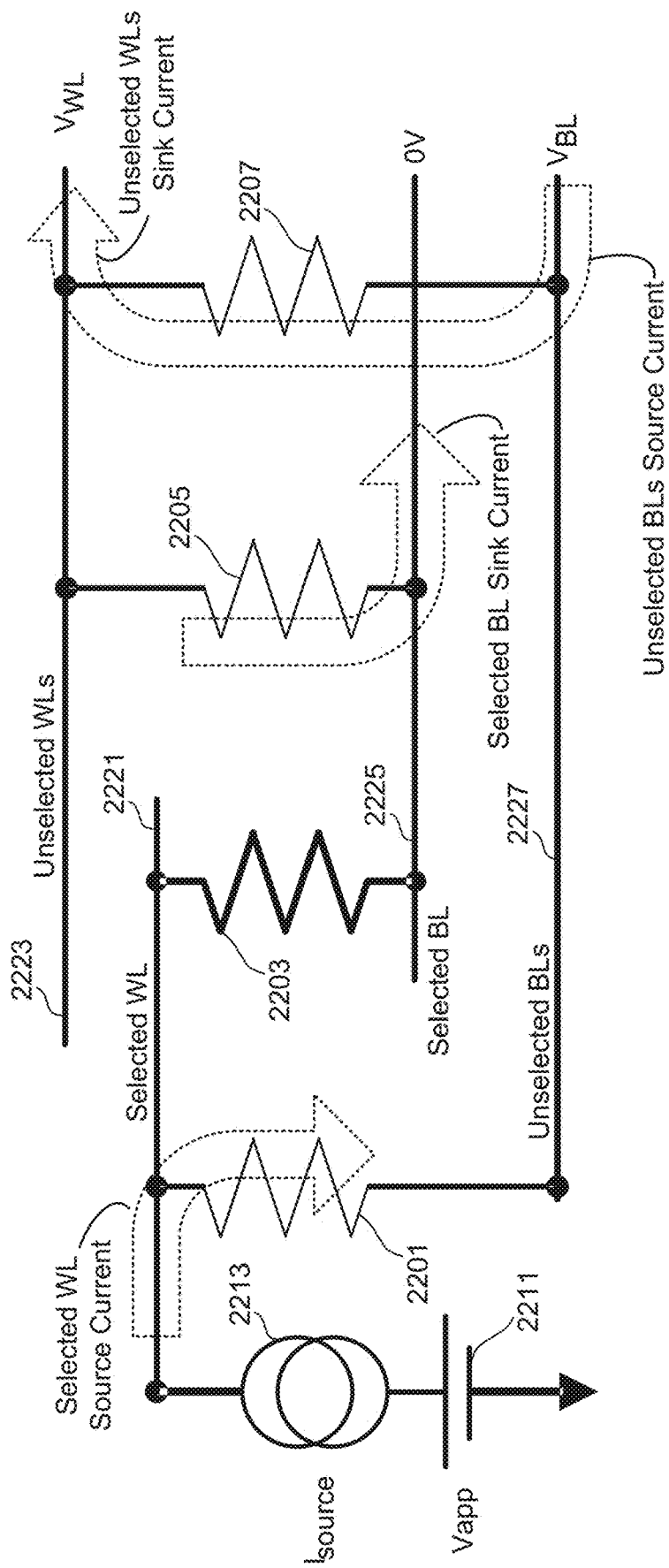
FIG. 22 is a schematic representation of the different bias levels across the memory cells in a cross-point array architecture and can be used to illustrate the different sources of leakage in one embodiment for biasing the array.

FIG. 22 is a schematic representation of the different bias levels across the memory cells in a cross-point array architecture and can be used to illustrate the different sources of leakage in one embodiment for biasing the array. A selected word line 2221 in this embodiment supplied by a current source $I_{source}$ 2213 at a voltage level $V_{app}$ (corresponding to $V_{sel}$ in FIG. 20) represented by a voltage source 2211. A selected bit line 2225 is set at a low voltage of 0V in this example. A selected memory element 2203 is connected between the selected word line 2221 and selected bit line 2225, where the current through this memory element is the desired current in a memory operation. The selected memory element 2203 is drawn as resistor, but represents, for example, the voltage dependent resistance of a selector in series with a resistive memory element, such as MRAM. The selected word line 2221 and selected bit line 2225 will also be connected to unselected memory cells, where the current through these is undesired leakage.

In the example of FIG. 22 and following discussion with respect to FIGS. 23A-23D, the $V_{app}$ 2211 and the current source $I_{source}$ 2213 are connected to the selected word line 2221 and selected bit line 2225 is at ground. If the polarity is reversed, the roles of the unselected word lines and unselected bit lines are also reversed. Although "ground" is used here as the low voltage level for convenience, more generally this can be another low voltage level that could be higher or lower with respect to ground (either chip ground or earth ground).

The leakage through unselected memory cells come in three varieties, as illustrated by the arrows on FIG. 22: selected word line source current leakage flow from a selected word line 2221 to the unselected bit line 2227 through a memory cell 2201; unselected word line 2223 current leakage flow into a selected bit line 2207 sink through a memory cell 2205; and an unselected bit line 2227 source to unselected word line 2223 leakage current through a memory cell 2207. Given that the number of unselected word lines and bit lines can each number into the thousands, a relatively small leakage through the individual unselected memory cells can add up to quite a large amount of leakage.

Figure 23A:
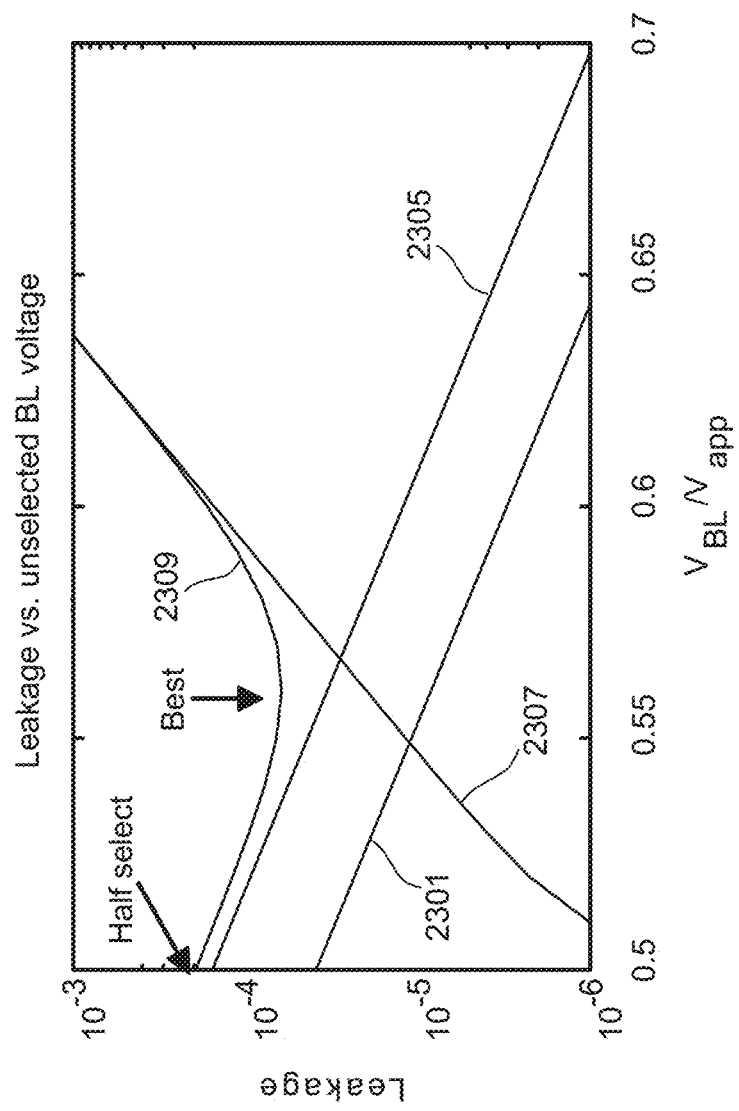
FIG. 23A considers the individual components of leakage and their cumulative effect for different values of the unselected bit line voltage $V_{BL}$.

FIG. 23A considers the individual components of leakage and their cumulative effect for different values of the unselected bit line voltage levels $V_{BL}$. In this example, $V_{WL}$ is changed anti-symmetrically with $V_{BL}$ so that $(V_{WL}+V_{BL})/2=V_{app}$. The cumulative leakage current is plotted on a log scale against the ratio of $V_{BL}/V_{app}$, so that a half-select corresponds to $V_{BL}/V_{app}=0.5$ at the left of the plot. The amount of leakage varies with the $V_{BL}$ voltage level. As $V_{BL}/V_{app}$ increases, the leakage 2301 from the selected word line 2221 source current to the unselected bit lines 2227 through a memory cells 2201 decrease, as does the leakage current 2305 from unselected word lines 2223 into selected bit line 2207 sinks through a memory cell 2205. As shown on the semi-log plot, this behavior is largely linear in $V_{BL}/V_{app}$. As the $V_{BL}$ increase from the half-select value increase, the leakage current from the unselected bit line 2227 source to unselected word line 2223 sink increases as illustrated at 2307. The combined leakage current 2309 from these three contributions initially decreases as $V_{BL}$ increases, reaches a minimum, then increases as the unselected source/unselected sink contribution 2307 comes to dominate.

The choice of the unselected voltages $V_{BL}$ and $V_{WL}$ is dependent upon design constraints. Among the potential constraints are array power constraints, such as, for example, a total current<1000 µA per array, as the maximum available current for all array transistors may have design constraints limiting how much total current could be supplied. Other potential constraints are one or both of a maximum bit line or maximum word line source or sink currents, such as, for example, as ~60 µA. Further constraints can be due to the maximum current that can be tolerated by the individual memory cells, such as <15 µA for data recovery (i.e., to not overwrite stored data values) and <30 µA for cell reliability since, once a threshold switching selector fires the current source will continue to force the same amount of current, which will now go through the selected cell, rather than the unselected lines. Consequently, the select current should not exceed the read disturb current level if data is to be recovered, or the maximum cell reliability current if data can be lost.

Figure 23C:
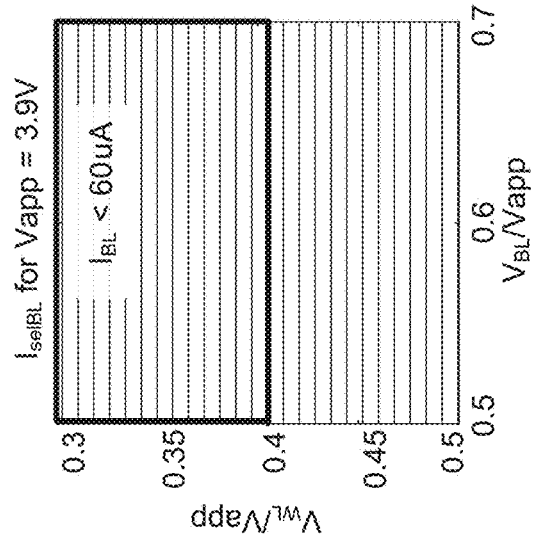
FIGS. 23B-23D can be used to illustrate a how the un-select voltages can be selected.
Figure 23D:
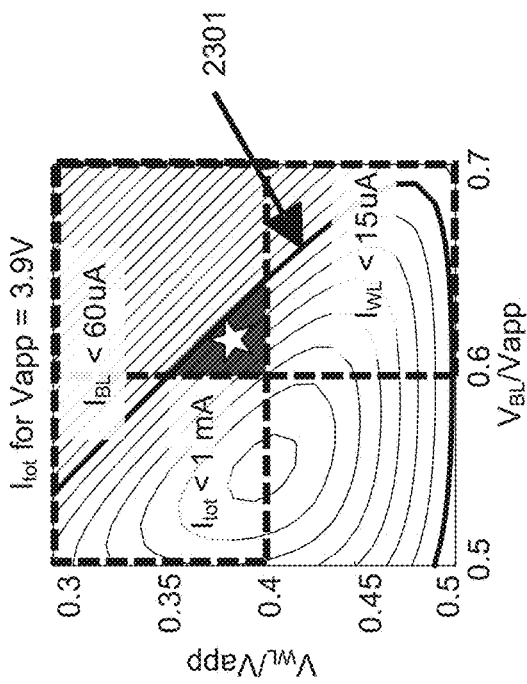
Figure 23B:
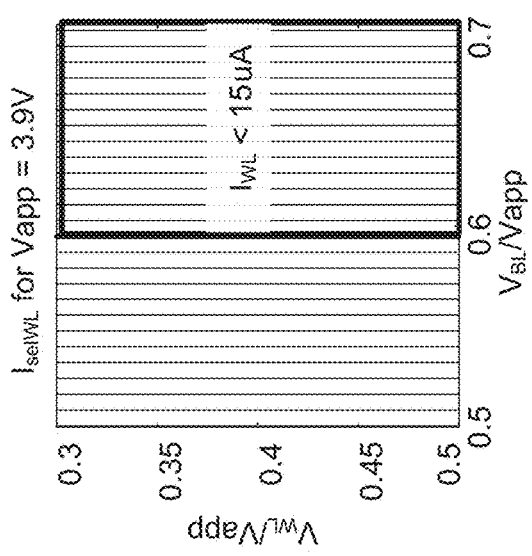

FIGS. 23B-23D can be used to illustrate a how the un-select voltages can be chosen. The goal of the process is to find appropriate half-select voltages that will concurrently satisfy the constraints of total current drawn, maximum sunk current, and maximum sourced current. Each constraint has a different allowed range of possible un-select voltages as illustrated in FIGS. 23B-23D for the example constraints of $I_{WL}$<15 µA; $I_{BL}$<60 µA; and $I_{total}$<1 mA. In this example, a $V_{app}$ voltage level of 3.8V-4.0V is used. In each of FIGS. 23B-23D the horizontal axis is $V_{BL}/V_{app}$, starting at the $V_{BL}=\frac{1}{2} V_{app}$ and increasing, and the vertical axis is $V_{WL}/V_{app}$, starting at the $V_{WL}=\frac{1}{2} V_{app}$ and decreasing, so that the standard half-select bias conditions are at bottom left. FIG. 23B illustrates the $I_{WL}$ behavior, which is independent, or largely independent, of $V_{WL}/V_{app}$ and decreases as $V_{WL}/V_{app}$ increases. The example design constraint of $I_{WL}$<15 µA lies to the right of $\sim V_{BL}/V_{app}=\sim 0.6$. FIG. 23C illustrates the $I_{BL}$ behavior, which is independent, or largely independent, of $V_{BL}/V_{app}$ and decreases as $V_{BL}/V_{app}$ decreases. The example design constraint of $I_{BL}$<15 µA lies above of $\sim V_{WL}/V_{app}=\sim 0.4$. Consequently, to meet both of these constraints, the $V_{BL}/V_{app}$ and $V_{WL}/V_{app}$ values need to be in the upper, right quadrant.

FIG. 23D considers the total leakage current as a function of $V_{BL}/V_{app}$ and $V_{WL}/V_{app}$, where the $I_{total}$<1 mA values to the left of heavier curved line 2301 that slopes downward to the right before curving back to the left. The range of voltages that meets all three criteria is illustrated in the grey triangle at the lower left of the upper right quadrant. An optimal choice is indicated by the star and represents the un-select voltages that provide the most margin.

Figure 24:
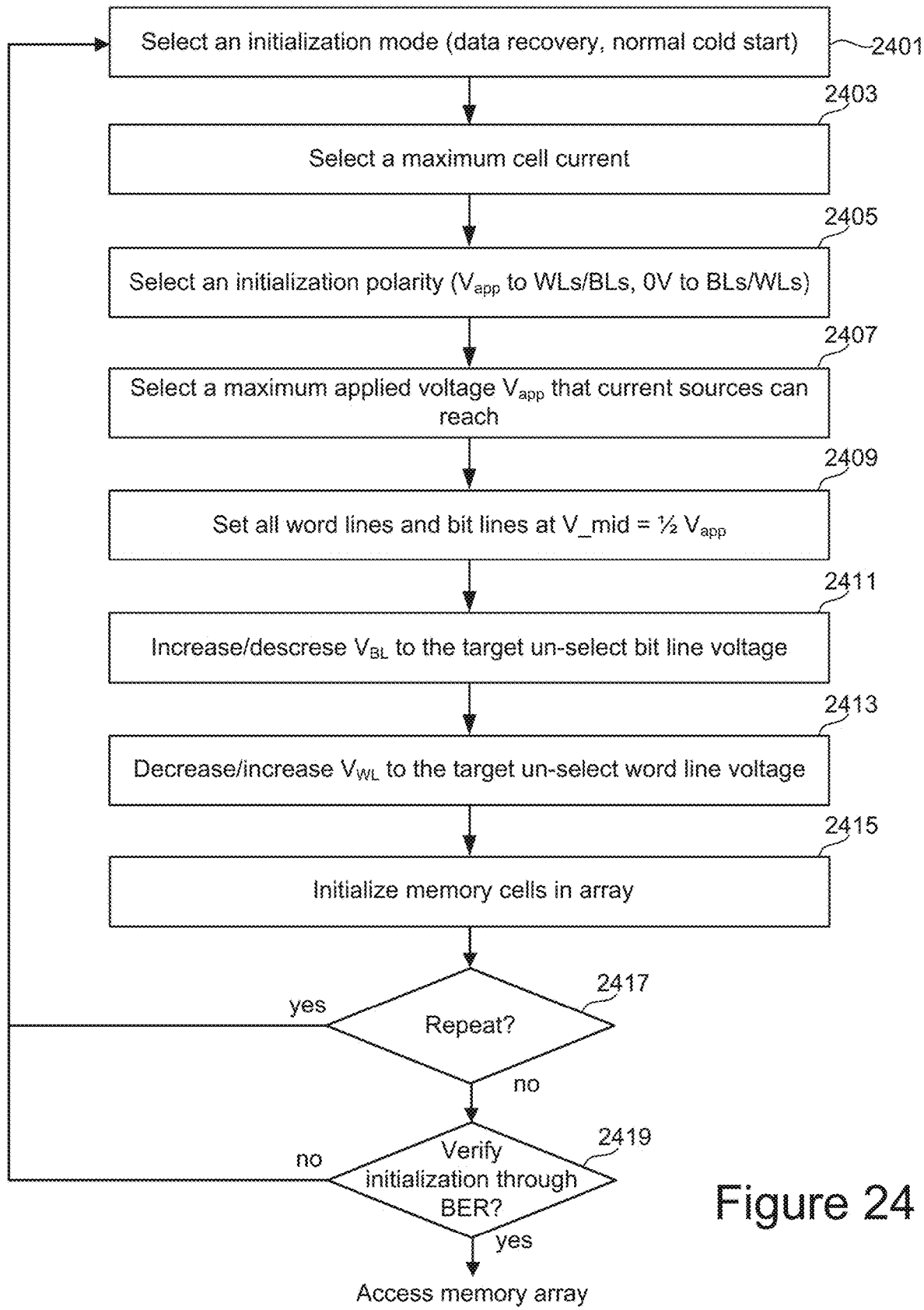
FIG. 24 is a flowchart to illustrate some feature of an initialization procedure for one set of embodiments.

FIG. 24 is a flowchart to illustrate some feature of an initialization procedure for one set of embodiments. The decision to perform an initialization operation can be made by the control circuitry can be based on criteria similar to those used above to determine whether Vth has drifted too high in the flows of FIGS. 15-18 after powering up a device, but with different determination levels, such as lower threshold time. For example, if a host requests a data read of a memory array not recently accessed, an initialization is performed prior to accessing the memory array. The flow begins at step 2401 with selection of an initialization mode, where this can be a data recovery initialization or a normal cold start. This can be determined by the control circuitry, such as the system control logic 560/660, memory controller 102, or combination of these. Depending on the embodiment, either mode can be selected initially or, for example, a data recovery mode can be tried first and, if this does not work, the normal cold start mode can be used. Based on the selected initialization mode, a maximum cell current is selected. For example, $I_{cell}$=15 uA<$I_{read\ distrub}$ for data recovery; $I_{cell}$=30 uA<$I_{damage}$ for normal cold start. The would correspond to the maximum values applied by the drivers of the row control circuitry 520/620 and row control circuitry 510/610 and these values can be settable parameters, such as register values in the system control logic 560/660.

If the polarity of currents applied to the memory cells is selectable, such as in the case of MRAM memory, an initialization polarity is selected at step 2405, either setting the initialization selected word lines high and initialization selected bit lines low or vice versa. For example, in the MRAM example, the memory cells should be in initialized in the normal "read polarity" for data recovery, as this is likely to cause read disturb. For normal cold start mode, the polarity can be either the normal read polarity or the opposite polarity. The maximum applied voltage $V_{app}$ that the current sources can support is selected as the initialization voltage at step 2407, where is can again be a settable parameter such as in the registers 561/661 of the system control logic 560/660. The $V_{app}$ level used as an initialization voltage can be the same access voltage as used in standard read operations, for example, or a higher voltage level if available from the control circuitry. At step 2409, the row control circuitry 520/620 and column control circuitry 510/610 bias all of the array's word lines and bit lines at the half-select values of ½ $V_{app}$ as would be used in a normal memory access, although the selected initialization voltage $V_{app}$ in step 2407 selected for initialization may be raised relative to the value used for reading of memory cells that have been recently initialized.

In steps 2411 and 2413, the control circuitry shifts the voltages used for the unselected word lines and unselected bit lines relative to the standard half-select values. If the selected polarity at step 2405 biases the initialization selected word lines at $V_{app}$, then at step 2411, the column control circuitry 510/610 increases the array's bit lines unselected voltage level $V_{BL}$ from the half-select values of ½ $V_{app}$ to the target unselected bit line voltage level $V_{BL}$; and at step 2413, the row control circuitry 520/620 decreases the array's word lines unselected voltage level $V_{WL}$ from the half-select values of ½ $V_{app}$ to the target unselected bit line voltage level $V_{WL}$. If instead the selected polarity biases the initialization selected bit lines at $V_{app}$, then at step 2411, the column control circuitry 510/610 decreases the array's bit lines unselected voltage level $V_{BL}$ from the half-select values of ½ $V_{app}$ to the target unselected bit line voltage level for this polarity's $V_{BL}$; and at step 2413, the row control circuitry 520/620 increases the array's word lines unselected voltage level $V_{WL}$ from the half-select values of ½ $V_{app}$ to the target unselected bit line voltage level $V_{WL}$ for this polarity. Steps 2411 and 2413 can be performed in either order or concurrently and, in some embodiments only one of steps 2411 and 2413 are used. The choice of initialization polarity changes whether the WL will be at a higher voltage than the BL during initialization, or vice versa. In both cases, the initialization procedure seeks to reduce the magnitude of the potential difference between the unselected WL voltage and the selected BL voltage and/or the magnitude of the potential difference between the unselected BL voltage and the selected WL The initialization for the memory cells of the array then follows a step 2415 by placing the $V_{app}$ voltage level selected at step 2407 across the initialization selected memory cells by the row column control circuitry 520/620 and row control circuitry 510/610 according to the polarity selected at 2405. The initialization can be performed on just a subset of the memory cells, but in most cases the whole of the array can be initialized. For example, when initializing all the memory cells, this can be done similarly to a read operation by sequentially initializing on a word line by word line basis for all or a subset of bit lines or by sequentially initializing on a bit line by bit line bases for all or a subset of word lines.

Depending on the embodiment, a number of options can follow the initialization of step 2415. In optional step 2417, a determination is made, such as by the system control logic 560/660, memory controller 102, or combination of these depending on whether to repeat the initialization process based on the degree to which the array is successfully initialized. If not, the flow loops back to step 2401, where steps 2401-2415 can be repeated with different conditions, such as one or more of a different selection mode (e.g., switching from data recovery mode to normal cold start), different maximum current, changing polarity, or changing the $V_{app}$ level. An optional step 2419 can verify the initialization process through bit error rate measurements and, if this indicates that the initialization was not sufficiently successful, also loop back to step 2401. Once the initialization is complete, the memory can then be accessed using a standard half-select biasing scheme.

Figure 25:
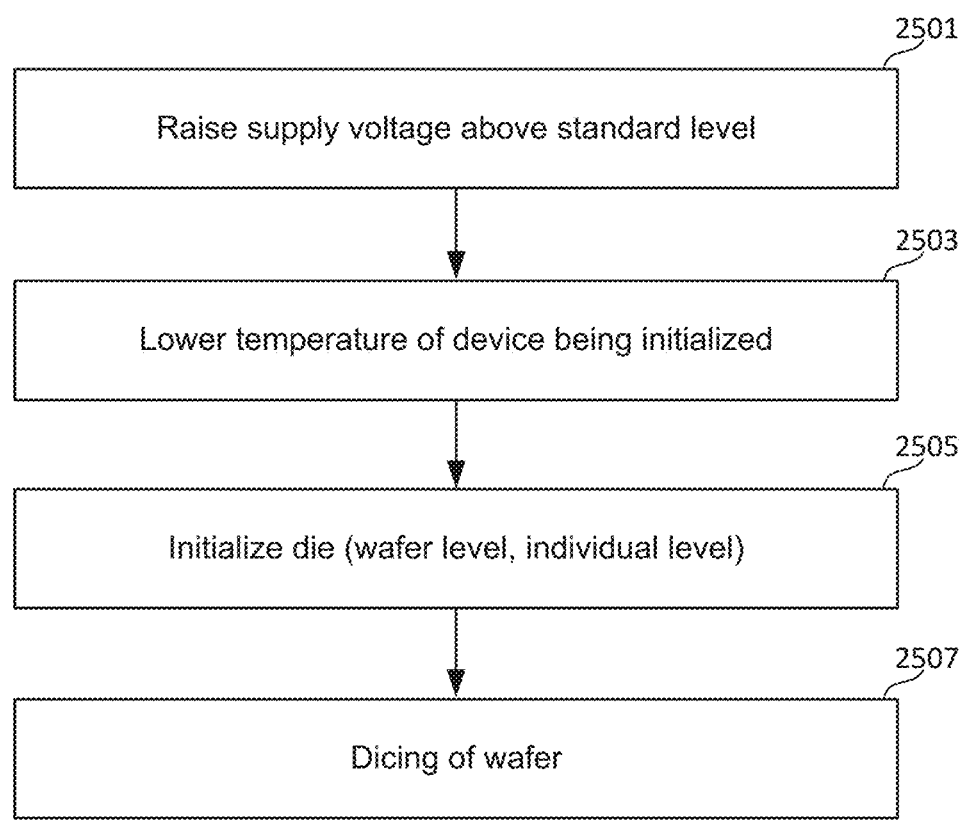
FIG. 25 is a flowchart to illustrate some optional procedures that can be included when the initialization process is a first fire initialization.

FIG. 25 is a flowchart to illustrate some optional procedures that can be included when the initialization process is a first fire initialization. As a first fire initialization can be performed at the fabrication facility, a test facility, or by a distributor prior to shipping of the memory die to a customer, this provides the ability to use initialization procedures not typically available to the end user. One option, at step 2501, is to use a higher supply voltage than would be used (e.g., due to power consumption considerations) or even available once the memory die is in use, since a factory or test facility will often both the access to the die and the voltages available to apply a higher than standard supply voltage level. For example, if a memory die is designed for use in a memory system that operates on a 3.3V supply level, as part of the test process on the memory die a first fire initialization could be performed with a supply level of 3.8V-4.0V. In an embodiment such as FIGS. 6A and 6B where the memory die 601 and control die 611 are on separate dies, a first fire initialization of a memory die 601 at fabrication or test center can be done with separate circuitry other than a control die 611 prior to bonding of the die pair, where this separate circuitry can provide the higher supply level voltages. For example, in the case of wafer level initialization in step 2505 prior to dicing of the individual memory chips not yet have been bonded to a control die and separate test/initialization circuitry would be used.

Step 2503 presents another initialization option that may be available at a factory or test facility for first fire initialization, but which would typically not be available once the die is with the consumer. More specifically, step 2503 reduces the die temperature to 0° C. or lower for the initialization process, such as by use of a cryo cooling stage or a refrigerator. At lower temperatures, leakage is typically reduced, which allows for the initialization voltages to be more effectively applied. Steps 2501 and 2503 can be used individually or together, either concurrently or in either order, when performing a first fire initialization at step 2505.

The first fire initialization at step 2505 can include one or both of steps 2501 and 2503. Another option available for first fire initialization is that initialization can occur on wafer level prior to dicing or on die level after packaging. If done on the wafer level, at step 2507, the wafer is diced, after which the individual dies can be shipped or packaged. First fire initialization also has a number of other features not available once the device is with the customer. One of these is that there is not yet any customer data that needs to be preserved. Another is that there is more time is available to initialize in factory than in customer's operational environment. For example, the availability of more time can be used to apply a first set of initialization voltages that can be used, followed by a second set of initialization voltages, where the difference between first and second set of voltages can include a higher supply voltage or different values for half-select voltages, the second set of voltages can include a different cell initialization polarity, or both. Additionally, the durations of applied voltages can be longer.

Considering cold start initializations, during a cold start the die temperature will be below the devices maximum operating temperature. The cold start initialization procedure can be initiated based on customer input. Alternately, the control circuitry for the memory die can detect a need to run cold start initialization and signal that the chip is unavailable during the procedure. Stored customer data content is generally assumed to be lost during cold start, but techniques can be used to retrieve the data content in some embodiments, similar to those described above with respect to FIGS. 15-18.

Data recovery will be destructive if the read procedure that is employed is self-"referenced-read" or "mixed-read". During a self-referenced-read, the read process includes a first read, followed by write to a fixed state, in turn followed by a second read. The difference between the first and second read is used to determine the original bit state. Mixed read uses self-referenced read on occasion. The self-referenced-read process requires a write back in order to return bits whose state changed during the write of the self-referenced-read if customer data is to remain stored in the array. For MRAM based memory cells, rewriting flipped bits requires changing the access polarity and would be unsuccessful without flipping how the unselected BL and WL are biased relative to the mid-point voltage. Since biasing the array to apply different un-select voltages takes time, in many cases it would not be practical to swap back and forth between different un-select voltages as all the array is initialized one bit at time. As such, data recovery for self-referenced read or mixed-read use-cases will often require the customer to write back the data following initialization, if desired. Data recovery can be non-destructive, however, if a fast read scheme is employed.

The embodiments presented above present a non-half select initialization procedure in which a second unselect bit line voltage and a second unselect word line voltage are applied during selector initialization, rather than half-select values used during standard operation. In MRAM or other architectures where both polarities are available, this also provides the ability of a procedure in which the threshold switching selectors are initialized in one polarity and then a second polarity, rather than just a single polarity. These techniques do not necessitate materials and process changes to reduce selector drift and first fire and enable the use of a larger range of selectors with higher drift and higher first fire, although the cold start initialization of selectors does require additional time.

According to a first set of aspects, an apparatus includes a control circuit configured to connect to an array comprising a plurality of bit lines and a plurality of word lines, the array formed according to a cross-point architecture in which each of a plurality of non-volatile memory cells is connected between a corresponding one of the bit lines and a corresponding one of the word lines, each memory cell comprising a programmable resistive element connected in series with a threshold switching selector configured to become conductive in response to application of a voltage level exceeding a corresponding threshold voltage. The control circuit is configured to access one or more selected memory cells of the array using a half-select biasing in which the control circuit is configured to concurrently apply an access voltage between a corresponding one or more selected bit lines and a corresponding one or more selected word lines, bias unselected bit lines of the array at a first unselected voltage, and bias unselected word lines at a second unselected voltage, the first unselected voltage and the second unselected voltage both intermediate to the access voltage and a low voltage level. The control circuit is also configured, prior to accessing the one or more selected memory cells, to perform an initialization of the array. To perform the initialization, the control circuit is configured to: bias one or more memory cells of the array, including one or more of the selected memory cells, by applying an initialization voltage between the biased memory cells' corresponding one or more bit lines and corresponding one or more word lines; while biasing the one or more memory cells of the array by applying the initialization voltage, bias bit lines other than the corresponding bit lines at a third unselected voltage; and while biasing the one or more memory cells of the array by applying the initialization voltage, bias word lines other than the corresponding word lines at a fourth unselected voltage, the third unselected voltage and the fourth unselected voltage both intermediate to the initialization voltage and the low voltage level, where one or both of the third unselected voltage and the fourth unselected voltage are shifted relative to the first unselected voltage and to the second unselected voltage, respectively.

In additional aspects, a method includes, prior to accessing memory cells of an array, initializing the array. Each of the memory cells comprises a programmable resistive element connected in series with a threshold switching selector, the array having a cross-point architecture in which each of the memory cells is connected between a corresponding word line and a corresponding bit line. Initializing the array comprises: applying an initialization voltage with a first polarity between the corresponding one or more word lines and the corresponding one or more bit lines of one or more memory cells selected for initialization; concurrently with applying the initialization voltage with a first polarity, biasing word lines of the array not corresponding the memory cells selected for initialization to a first voltage level intermediate to the initialization voltage and a low voltage level; and concurrently with applying the initialization voltage with a first polarity, biasing bit lines of the array not corresponding the memory cells selected for initialization to a second voltage level intermediate to the initialization voltage and the low voltage level, wherein first voltage level and the second voltage level are different.

In another set of aspects, a non-volatile memory device comprising a memory array and one or more control circuits connected to the memory array. The memory array can include: a plurality of word lines; a plurality of bit lines; and a plurality of memory cells each comprising a programmable resistive element connected in series with a threshold switching selector, the memory array having a cross-point architecture in which each of the memory cells is connected between a corresponding one of the bit lines and a corresponding one of the word lines. The one or more control circuits are configured to: read the memory cells using a half-select biasing scheme; and initialize the memory array. To initialize the memory, the one or more control circuits are configured to concurrently: apply an initialization voltage between the corresponding one or more word lines and the corresponding one or more bit lines of one or more memory cells selected for initialization; biasing word lines of the array not corresponding the memory cells selected for initialization to a first voltage level intermediate to the initialization voltage and a low voltage level; and biasing bit lines of the array not corresponding the memory cells selected for initialization to a second voltage level intermediate to the initialization voltage and the low voltage level, wherein first voltage level and the second voltage level are different.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to an array comprising a plurality of bit lines and a plurality of word lines, the array formed according to a cross-point architecture in which each of a plurality of non-volatile memory cells is connected between a corresponding one of the bit lines and a corresponding one of the word lines, each memory cell comprising a programmable resistive element connected in series with a threshold switching selector configured to become conductive in response to application of a voltage level exceeding a corresponding threshold voltage, the control circuit is configured to:
access one or more selected memory cells of the array using a half-select biasing in which the control circuit is configured to concurrently apply an access voltage between a corresponding one or more selected bit lines and a corresponding one or more selected word lines, bias unselected bit lines of the array at a first unselected voltage, and bias unselected word lines at a second unselected voltage, the first unselected voltage and the second unselected voltage both intermediate to the access voltage and a low voltage level; and
prior to accessing the one or more selected memory cells, perform an initialization of the array in which the control circuit is configured to:
bias one or more memory cells of the array, including one or more of the selected memory cells, by applying an initialization voltage between the biased memory cells' corresponding one or more bit lines and corresponding one or more word lines;
while biasing the one or more memory cells of the array by applying the initialization voltage, bias bit lines other than the corresponding bit lines at a third unselected voltage; and
while biasing the one or more memory cells of the array by applying the initialization voltage, bias word lines other than the corresponding word lines at a fourth unselected voltage, the third unselected voltage and the fourth unselected voltage both intermediate to the initialization voltage and the low voltage level, where one or both of the third unselected voltage and the fourth unselected voltage are shifted relative to the first unselected voltage and to the second unselected voltage, respectively.

2. The apparatus of claim 1, wherein the control circuit is formed on a control die, the apparatus further comprising:
a memory die including the array comprising the non-volatile memory cells, the memory die formed separately from and bonded to the control die.

3. The apparatus of claim 1, wherein the first unselected voltage is the voltage level as the second unselected voltage.

4. The apparatus of claim 1, wherein the access voltage is the same voltage level as the initialization voltage.

5. The apparatus of claim 1, wherein the control circuit is configured to access the one or more selected memory cells in a read operation.

6. The apparatus of claim 1, wherein the control circuit is configured to access the one or more selected memory cells in a write operation.

7. The apparatus of claim 1, wherein, to bias the one or memory cells of the array, the control circuit is configured to:
apply the initialization voltage to the corresponding one or more word lines; and
to set the corresponding one or more bit lines to the low voltage level, wherein the voltage level of the third unselected voltage is a higher voltage level than the first unselected voltage and/or the voltage level of the fourth unselected voltage is lower voltage level than the second unselected voltage.

8. The apparatus of claim 1, wherein, to bias the one or memory cells of the array, the control circuit is configured to:
apply the initialization voltage to the corresponding one or more bit lines; and
to set the corresponding one or more word lines to the low voltage level, wherein the voltage level of the third unselected voltage is a lower voltage level than the first unselected voltage and/or the voltage level of the fourth unselected voltage is higher voltage level than the second unselected voltage.

9. The apparatus of claim 1, wherein, to bias the one or memory cells of the array, the control circuit is configured to:
initially apply the initialization voltage to a first of the corresponding one or more word lines or corresponding one or more bit lines while setting a second of the corresponding one or more word lines or corresponding one or more bit lines to the low voltage level; and
subsequently apply the initialization voltage to the second of the corresponding one or more word lines or corresponding one or more bit lines while setting the first of the corresponding one or more word lines or corresponding one or more bit lines to the low voltage level.

10. The apparatus of claim 1, wherein, in performing an initialization of the array, the control circuit is further configured to initialize all of the memory cells of the array on a sequential word line by word line basis.

11. The apparatus of claim 1, wherein, in performing an initialization of the array, the control circuit is further configured to initialize all of the memory cells of the array on a sequential bit line by bit line basis.

12. The apparatus of claim 1, further comprising the array, wherein the resistive element is a magnetoresistive random access memory (MRAM) memory device.

13. The apparatus of claim 3, further comprising the array, wherein the resistive element is a resistive random access memories (ReRAM) memory device.

14. The apparatus of claim 3, further comprising the array, wherein the resistive element is a phase change memory (PCM) memory device.

15. A method, comprising:
prior to accessing memory cells of an array, initializing the array, where each of the memory cells comprise a programmable resistive element connected in series with a threshold switching selector, the array having a cross-point architecture in which each of the memory cells is connected between a corresponding word line and a corresponding bit line, wherein initializing the array comprises:
applying an initialization voltage with a first polarity between the corresponding one or more word lines and the corresponding one or more bit lines of one or more memory cells selected for initialization;
concurrently with applying the initialization voltage with a first polarity, biasing word lines of the array not corresponding the memory cells selected for initialization to a first voltage level intermediate to the initialization voltage and a low voltage level; and
concurrently with applying the initialization voltage with a first polarity, biasing bit lines of the array not corresponding the memory cells selected for initialization to a second voltage level intermediate to the initialization voltage and the low voltage level, wherein first voltage level and the second voltage level are different.

16. The method of claim 15, wherein initializing the array further comprises:
subsequent to applying an initialization voltage with the first polarity, applying the initialization voltage with a second polarity between the corresponding one or more word lines and the corresponding one or more bit lines of the one or more memory cells selected for initialization.

17. The method of claim 15, further comprising:
prior to initializing the array, lowering a temperature of a device on which the array is formed; and
maintaining the device at a lowered temperature during the initializing.

18. The method of claim 15, further comprising:
receiving the initialization voltage from an external source, the received initialization voltage having a high level than used when subsequently accessing the memory cells.

19. The method of claim 15, wherein the array is initialized prior to providing a device on which the array is formed to a customer.

20. A non-volatile memory device, comprising:
a memory array, comprising:
a plurality of word lines;
a plurality of bit lines; and
a plurality of memory cells each comprising a programmable resistive element connected in series with a threshold switching selector, the memory array having a cross-point architecture in which each of the memory cells is connected between a corresponding one of the bit lines and a corresponding one of the word lines; and
one or more control circuits connected to the memory array and configured to:
read the memory cells using a half-select biasing scheme; and
initialize the memory array, where, to initialize the memory, the one or more control circuits are configured to concurrently:
apply an initialization voltage between the corresponding one or more word lines and the corresponding one or more bit lines of one or more memory cells selected for initialization;
biasing word lines of the array not corresponding the memory cells selected for initialization to a first voltage level intermediate to the initialization voltage and a low voltage level; and
biasing bit lines of the array not corresponding the memory cells selected for initialization to a second voltage level intermediate to the initialization voltage and the low voltage level, wherein first voltage level and the second voltage level are different.

* * * * *